(12) United States Patent
Lee et al.

(10) Patent No.: US 12,315,559 B2
(45) Date of Patent: May 27, 2025

(54) LATCH-BASED STORAGE CIRCUITS HAVING EFFICIENT INTEGRATED CIRCUIT LAYOUTS

(71) Applicant: Samsung Electronics Co., Ltd., Suwon-si (KR)

(72) Inventors: Kijun Lee, Suwon-si (KR); Youngmin Kang, Gwangju (KR); Ikjoon Chang, Yongin-si (KR); Kyomin Sohn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 18/157,035

(22) Filed: Jan. 19, 2023

(65) Prior Publication Data

US 2023/0352084 A1    Nov. 2, 2023

(30) Foreign Application Priority Data

May 2, 2022 (KR) .................. 10-2022-0054120
Aug. 2, 2022 (KR) .................. 10-2022-0096046

(51) Int. Cl.
*G11C 11/412*     (2006.01)
*G11C 11/419*     (2006.01)

(52) U.S. Cl.
CPC .......... *G11C 11/412* (2013.01); *G11C 11/419* (2013.01)

(58) Field of Classification Search
CPC .... G11C 11/412; G11C 11/419; G11C 11/418
USPC .......................................... 365/154
See application file for complete search history.

(56) References Cited

U.S. PATENT DOCUMENTS

| | | | |
|---|---|---|---|
| 7,716,411 B2 | 5/2010 | Panabaker et al. | |
| 9,081,926 B2 | 7/2015 | Lilja | |
| 9,344,067 B1* | 5/2016 | Wu | H10B 10/12 |
| 9,406,356 B2* | 8/2016 | Kim | G11C 7/1048 |
| 9,418,717 B2 | 8/2016 | Hsu et al. | |
| 10,783,954 B2 | 9/2020 | Wu et al. | |
| 2011/0242880 A1* | 10/2011 | White | G11C 11/419 |
| | | | 365/189.15 |
| 2016/0260474 A1* | 9/2016 | Liu | G11C 11/34 |

FOREIGN PATENT DOCUMENTS

CN      112017708 A    12/2020

* cited by examiner

*Primary Examiner* — Fernando Hidalgo
(74) *Attorney, Agent, or Firm* — Myers Bigel, P.A.

(57) ABSTRACT

A storage circuit includes a multi-stage latch circuit having first to fourth transistor pairs therein, which respectively include a pull-up transistor and a pull-down transistor connected in series through a corresponding one of first to fourth storage nodes. An access circuit is provided, which has a plurality of access transistors of different conductivity type therein. The access transistors are electrically coupled to at least two of the first to fourth storage nodes and configured to enable writing of data bits into at least some of the first to fourth storage nodes, and reading of data bits from at least some of the first to fourth storage nodes. A control circuit is provided, which controls the access circuit during the writing and reading.

19 Claims, 22 Drawing Sheets

LATCH-BASED STORAGE CIRCUITS HAVING EFFICIENT INTEGRATED CIRCUIT LAYOUTS

REFERENCE TO PRIORITY APPLICATION

This application claims priority under 35 USC § 119 to Korean Patent Application No. 10-2022-0054120, filed May 2, 2022, and to Korean Patent Application No. 10-2022-0096046, filed Aug. 2, 2022, the disclosures of which are hereby incorporated herein by reference.

BACKGROUND

The present disclosure relates to integrated circuit devices and, more particularly, to integrated circuit memory devices having latch-based storage devices therein.

Latch circuits for storing data are one of the most widely used circuits in integrated circuit devices. As the degree of integration of integrated circuits increases, capacitance at the storage node of latch circuits is reduced. Therefore, there are more soft errors caused when data stored in the storage node of a latch circuit changes unintentionally. Soft errors are a phenomenon in which data stored in the latch circuit changes due to cosmic rays, such as alpha particles, etc.

Latch circuits that are more resistant to soft errors have been suggested. The latch circuit that best represents this is a latch circuit called a dual interlocked storage cell (DICE).

SUMMARY

Example embodiments may provide a latch-based storage circuit having small size while being robust to soft errors and maintaining high performance.

Example embodiments may provide an integrated circuit device having latch-based storage circuits therein, which have small size and are resistant to soft errors yet maintain high performance (e.g., high write/read speed).

According to some example embodiments, a storage circuit includes a latch circuit, an access circuit and a control circuit. The latch circuit includes first to fourth transistor pairs, each of which includes a p-channel metal-oxide semiconductor (PMOS) transistor and a n-channel metal-oxide semiconductor (NMOS) transistor connected in series through a corresponding one of first to fourth storage nodes, and each of the first to fourth storage nodes is connected to a gate of an NMOS transistor of a transistor pair in a preceding stage and a gate of a PMOS transistor of a transistor pair in a following stage. The access circuit includes access transistors having different conductivity type. These access transistors are connected to at least two storage nodes of the first to fourth storage nodes. In addition, the access circuit writes data bits into at least a portion of the first to fourth storage nodes or reads data bits from at least a portion of the first to fourth storage nodes. The control circuit controls the access circuit.

According to example embodiments, a semiconductor device includes a plurality of dual interlocked storage cell (DICE) latches connected in parallel to a bit-line, a write driver connected to the bit-line and a control circuit. The control circuit controls respective one of the plurality of DICE latches through the word-line and the complementary word-line. Each of the plurality of DICE latches includes a latch circuit, an access circuit and a control circuit. The latch circuit includes first to fourth transistor pairs, each of which includes a p-channel metal-oxide semiconductor (PMOS) transistor and a n-channel metal-oxide semiconductor (NMOS) transistor connected in series through a corresponding one of first to fourth storage nodes. Each of the first to fourth storage nodes is connected to a gate of an NMOS transistor of a transistor pair in a preceding stage and a gate of a PMOS transistor of a transistor pair in a following stage. The access circuit includes access transistors having different conductivity types, which are connected to at least two storage nodes of the first to fourth storage nodes. The access circuit is configured to write data bits into at least a portion of the first to fourth storage nodes, and read data bits stored in at least a portion of the first to fourth storage nodes.

According to additional embodiments, a storage circuit includes a latch circuit, an access circuit and a control circuit. The latch circuit includes first to fourth transistor pairs, each of which includes a p-channel metal-oxide semiconductor (PMOS) transistor and a n-channel metal-oxide semiconductor (NMOS) transistor connected in series through a corresponding one of first to fourth storage nodes. Each of the first to fourth storage nodes is connected to a gate of an NMOS transistor of a transistor pair in a preceding stage and a gate of a PMOS transistor of a transistor pair in a following stage. The access circuit includes access transistors connected to at least two storage nodes of the first to fourth storage nodes. The access circuit is configured to write data bits into at least a portion of the first to fourth storage nodes, and read data bits stored in at least a portion of the first to fourth storage nodes. The control circuit is configured to control the access circuit. The access circuit includes a first NMOS access transistor, a second NMOS access transistor, a third NMOS access transistor, and a fourth NMOS access transistor. The first NMOS access transistor has a source connected to the first storage node, a gate connected to a word-line and a drain connected to a bit-line. The second NMOS access transistor has a source connected to the second storage node, a gate connected to the word-line and a drain connected to a complementary bit-line. The third NMOS access transistor has a source connected to the third storage node, a gate connected to a write word-line and a drain connected to a write bit-line. The fourth NMOS access transistor has a source connected to the fourth storage node, a gate connected to the write word-line and a drain connected to a complementary write bit-line.

Accordingly, in the storage circuit, the access circuit includes access transistors having different conductivity types, which are connected to at least two storage nodes of first to fourth storage nodes of a latch circuit. The access circuit is configured to write data bits into at least a portion of the first to fourth storage nodes, and read data bits stored in at least a portion of the first to fourth storage nodes. The control circuit is configured to enable a word-line and a complementary word-line during a write operation and disable the complementary word-line and enables the word-line during a read operation. Therefore, the storage circuit may reduce occupied area, prevent read disturbance and be robust at preventing soft errors.

BRIEF DESCRIPTION OF THE DRAWINGS

Example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
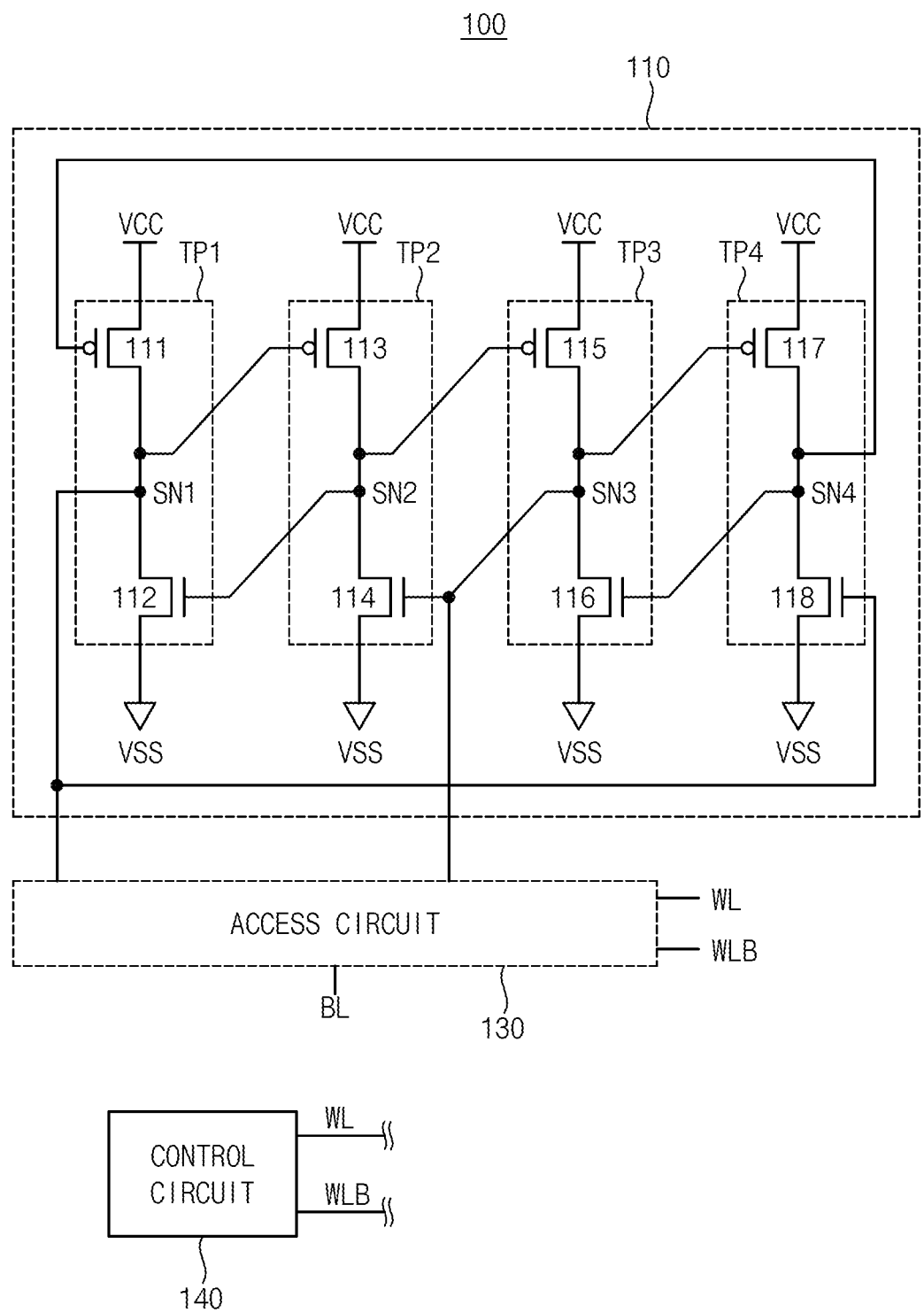
FIG. 1 is a block diagram illustrating a storage circuit according to example embodiments.

FIG. 1 is a block diagram illustrating a storage circuit according to example embodiments. Referring to FIG. 1, a storage circuit 100 may include a latch circuit 110, an access circuit 130 and a control circuit 140. As shown, the latch circuit 110 may include first to fourth transistor pairs TP1, TP2, TP3 and TP4, connected as illustrated. Each of the first to fourth transistor pairs TP1, TP2, TP3 and TP4 may include a p-channel metal-oxide semiconductor (PMOS) "pull-up" transistor and an n-channel metal-oxide semiconductor (NMOS) "pull-down" transistor connected in series through a corresponding one of first to fourth storage nodes SN1, SN2, SN3 and SN4. Each of the first to fourth storage nodes SN1, SN2, SN3 and SN4 may be connected to a gate of an NMOS pull-down transistor of a transistor pair in a previous stage and a gate of a PMOS pull-up transistor of a transistor pair in a next stage.

The access circuit 130 may be connected to a word-line WL, a complementary word-line WLB and a bit-line BL. The access circuit 130 may include access transistors having different conductivity types. The access transistors may be connected to at least two storage nodes of the first to fourth storage nodes SN1, SN2, SN3 and SN4 and the access circuit 130 may store data bits in at least a portion of the first to fourth storage nodes SN1, SN2, SN3 and SN4 or may read data bits stored in at least a portion of the first to fourth storage nodes SN1, SN2, SN3 and SN4. The control circuit 140 may control the access circuit 130 by controlling voltage levels of the word-line WL and the complementary word-line WLB.

The first transistor pair TP1 may include a PMOS transistor 111 and an NMOS transistor 112. The PMOS transistor 111 may have a source coupled to a power supply voltage VCC, a gate coupled to the fourth storage node SN4 and a drain coupled to the first storage node SN1. The NMOS transistor 112 may have a drain coupled to the first storage node SN1, a gate coupled to the second storage node SN1 and a source coupled to a ground voltage VSS. Similarly, the second transistor pair TP2 may include a PMOS transistor 113 and an NMOS transistor 114. The PMOS transistor 113 may have a source coupled to the power supply voltage VCC, a gate coupled to the first storage node SN1 and a drain coupled to the second storage node SN2. The NMOS transistor 114 may have a drain coupled to the second storage node SN2, a gate coupled to the third storage node SN3 and a source coupled to the ground voltage VSS. The third transistor pair TP3 may include a PMOS transistor 115 and an NMOS transistor 116. The PMOS transistor 115 may have a source coupled to the power supply voltage VCC, a gate coupled to the second storage node SN2 and a drain coupled to the third storage node SN3. The NMOS transistor 116 may have a drain coupled to the third storage node SN3, a gate coupled to the fourth storage node SN4 and a source coupled to the ground voltage VSS. Finally, the fourth transistor pair TP4 may include a PMOS transistor 117 and an NMOS transistor 118. The PMOS transistor 117 may have a source coupled to the power supply voltage VCC, a gate coupled to the third storage node SN3 and a drain coupled to the fourth storage node SN4. The NMOS transistor 118 may have a drain coupled to the fourth storage node SN4, a gate coupled to the first storage node SN1 and a source coupled to the ground voltage VSS.

The access circuit 130 may be connected to at least two storage nodes (for example, the first storage node SN1 and the third storage node SN3) of the first to fourth storage nodes SN1, SN2, SN3 and SN4. The control circuit 140 may store data bits input through the bit-line BL in at least a portion of the first to fourth storage nodes SN1, SN2, SN3 and SN4 may output data bits stored in at least a portion of the first to fourth storage nodes SN1, SN2, SN3 and SN4 through the bit-line BL by adjusting voltage levels of the word-line WL and the complementary word-line WLB to control the access circuit 130.

Figure 2:
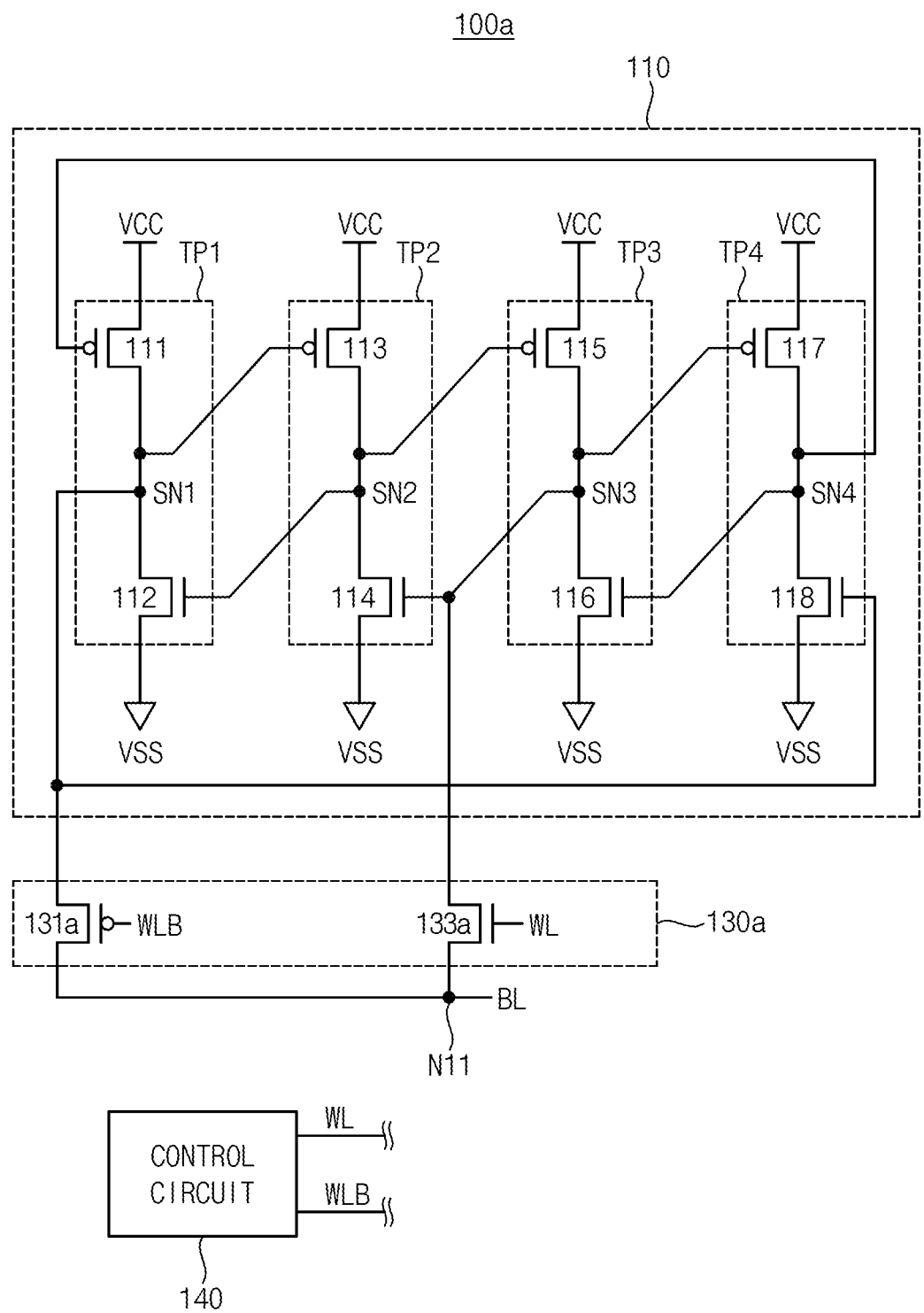
FIG. 2 is a circuit diagram illustrating an example of the storage circuit of FIG. 1 according to example embodiments.

FIG. 2 is a circuit diagram illustrating an embodiment of the storage circuit of FIG. 1. Referring to FIG. 2, a storage circuit 100a may include a latch circuit 110, an access circuit 130a and a control circuit 140. The latch circuit 110 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage. Configuration and operation of the latch circuit 110 and the control circuit 140, as previously described with respect to FIG. 1, will be omitted.

The access circuit 130a may include a first PMOS access transistor 131a and a first NMOS access transistor 133a. The first PMOS access transistor 131a may have a source connected to the first storage node SN1, a gate connected to the complementary word-line WLB and a drain connected to the bit-line BL. In addition, the first NMOS access transistor 133a may have a source connected to the third storage node SN3, a gate connected to the word-line WL and a drain connected to the bit-line BL.

Because the access circuit 130a includes the first PMOS access transistor 131a and the first NMOS access transistor 133a, the latch circuit 110 and the access circuit 130a in FIG. 2 may be referred to as a DICE latch (i.e., a dual interlocked storage cell), which is typically highly resistant to single event upsets (SEU). The control circuit 140, in a write operation, may store data bits in the first storage node SN1 and the third storage node SN3, which are based on a first data bit provided through the bit-line BL, by turning on the first PMOS access transistor 131a and the first NMOS access transistor 133a by adjusting voltage levels of the complementary word-line WLB and the word-line WL. In addition, during a read operation, a data bit stored in the third storage node SN3 can be read by turning off the first PMOS access transistor 131a and by turning on the first NMOS access transistor 133a, or a data bit stored in the first storage node SN1 can be read by turning on the first PMOS access transistor 131a and by turning off the first NMOS access transistor 133a, by adjusting voltage levels of the complementary word-line WLB and the word-line WL. In addition, when the data bit is stored in the first storage node SN1 and the third storage node SN3, a data bit having a logic level complementary with the data bit stored in the first storage node SN1 and the third storage node SN3, may be stored in the second storage node SN2 and the fourth storage node SN4.

Figure 3:
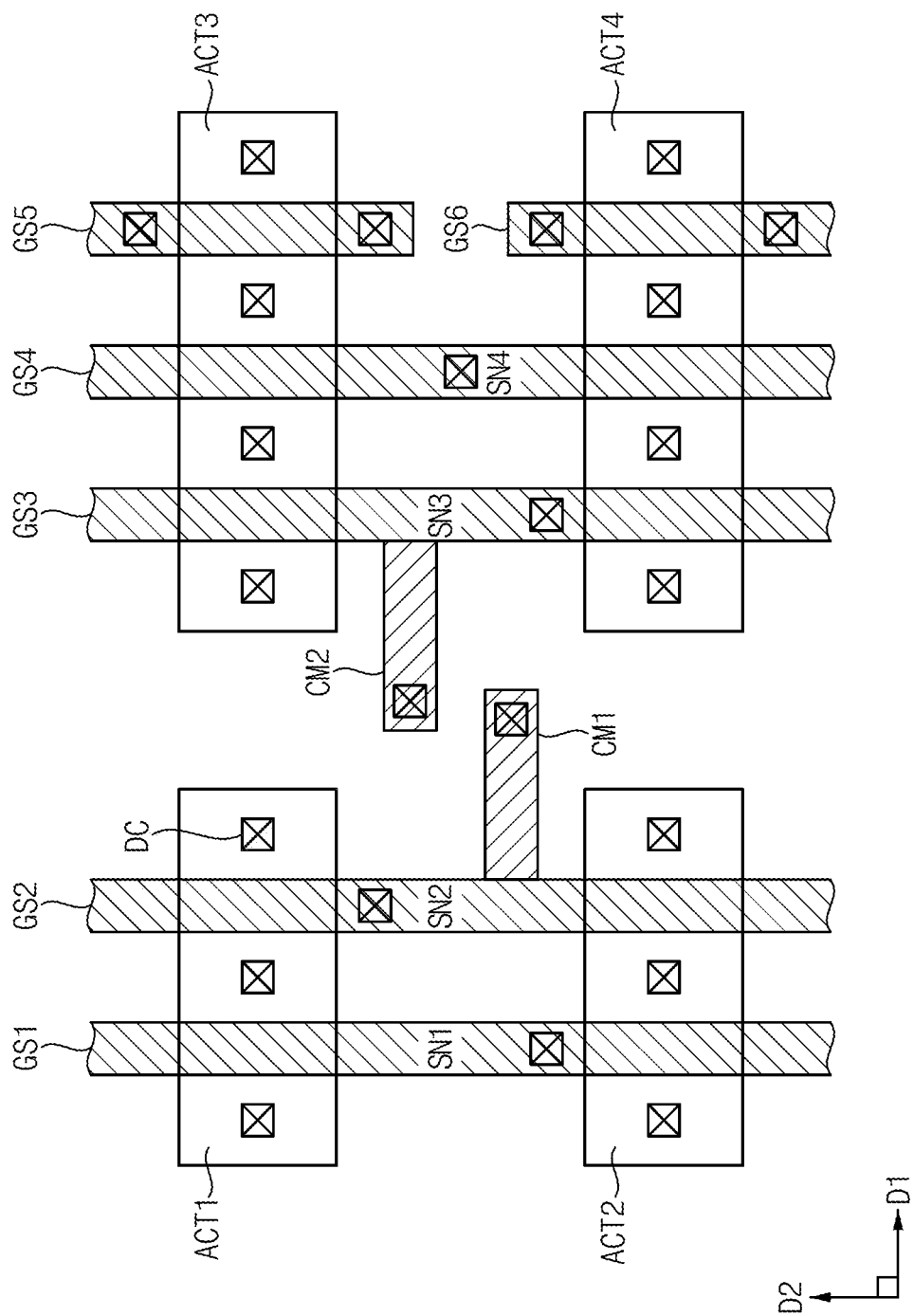
FIG. 3 illustrates an example layout of the latch circuit and the access circuit in the storage circuit of FIG. 2 according to example embodiments.

FIG. 3 illustrates an example layout of the latch circuit and the access circuit in the storage circuit of FIG. 2 according to example embodiments. Referring to FIGS. 2 and 3, the first transistor pair TP1 and the second transistor pair TP2 may be provided by (or may include) a first active pattern ACT1 and a second active pattern ACT2, which extend in a first direction D1 and are spaced apart from each other in a second direction D2 crossing the first direction D1, and a first gate pattern GS1 and a second gate pattern GS2, which are provided on the first active pattern ACT1 and the second active pattern ACT2. The first gate pattern GS1 and the second gate pattern GS2 may extend in the second direction D2 and may be spaced apart from each other in the first direction D1.

The third transistor pair TP3 and the fourth transistor pair TP4 may be provided by (or may include) a third active pattern ACT3 and a fourth active pattern ACT4, which extend in the first direction D1 and are spaced apart from each other in the second direction D2, and a third gate pattern GS3 and a fourth gate pattern GS4 provided on the third active pattern ACT3 and the fourth active pattern ACT4. The third active pattern ACT3 may be spaced apart from the first active pattern ACT1 in the first direction D1 and the fourth active pattern ACT4 may be spaced apart from the second active pattern ACT2 in the first direction D1. The third gate pattern GS3 and the fourth gate pattern GS4 extend in the second direction D2 and may be spaced apart from each other in the first direction D1.

In addition, the first PMOS access transistor 131a may be provided by the third active pattern GS3 and a fifth gate pattern GS5 provided on the third active pattern ACT3, which is spaced apart from the fourth gate pattern GS4 in the first direction D1 and extends in the second direction D2. The first NMOS access transistor 133a may be provided by the fourth active pattern ACT4 and a sixth gate pattern GS6 provided on the fourth active pattern ACT4, which is spaced apart from the fourth gate pattern GS4 in the first direction D1, is spaced apart from the fifth gate pattern GS5 in the second direction D2 and extends in the second direction D2. The gate of the NMOS transistor 114 and the third storage node SN3 may be connected to each other by a first connection pattern CM1 extending in the first direction D1 from the second gate pattern GS2 and a second connection pattern CM2 extending in the first direction D1 from the third gate pattern GS3.

A direct contact DC for connecting another pattern may be formed in each of the first gate pattern GS1, the second gate pattern GS2, the third gate pattern GS3, the fourth gate pattern GS4, the fifth gate pattern GS5 and the sixth gate pattern GS6 and in each of the first active pattern ACT1, the second active pattern ACT2, the third active pattern ACT3 and the fourth active pattern ACT4. In addition, each of the first storage node SN1, the second storage node SN2, the third storage node SN3 and the fourth storage node SN4 may be provided in respective one of the first gate pattern GS1, the second gate pattern GS2, the third gate pattern GS3 and the fourth gate pattern GS4. The first gate pattern GS1, the second gate pattern GS2, the third gate pattern GS3, the fourth gate pattern GS4, the fifth gate pattern GS5 and the sixth gate pattern GS6 may extend in the second direction D2 and may be arranged in parallel in the first direction D1.

The first gate pattern GS1 and the first active pattern ACT1 may correspond to the PMOS transistor 111 and the first gate pattern GS1 and the second active pattern ACT2 may correspond to the NMOS transistor 112. The second gate pattern GS2 and the first active pattern ACT1 may correspond to the PMOS transistor 113 and the second gate pattern GS2 and the second active pattern ACT2 may correspond to the NMOS transistor 114. The third gate pattern GS3 and the third active pattern ACT3 may correspond to the PMOS transistor 115 and the third gate pattern GS3 and the fourth active pattern ACT4 may correspond to the NMOS transistor 116. The fourth gate pattern GS4 and the third active pattern ACT3 may correspond to the PMOS transistor 117 and the fourth gate pattern GS4 and the fourth active pattern ACT4 may correspond to the NMOS transistor 118. The fifth gate pattern GS5 and the third active pattern ACT3 may correspond to the first PMOS access transistor 131a and the sixth gate pattern GS6 and the fourth active pattern ACT4 may correspond to the first NMOS access transistor 133a. The complementary word-line WLB and the bit-line BL may be connected to the direct contacts DC on the fifth gate pattern GS5 and the word-line WL and the bit-line BL may be connected to the direct contacts DC on the sixth gate pattern GS6.

Figure 4:
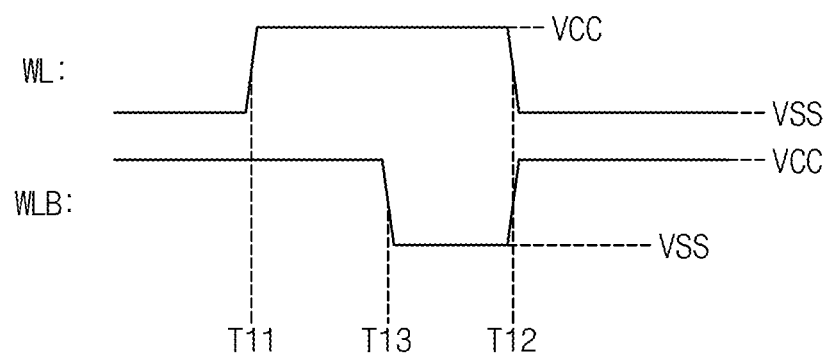
FIG. 4 illustrates voltage levels of the word-line and the complementary word-line in a write operation of the storage circuit of FIG. 2 according to example embodiments.

FIG. 4 illustrates voltage levels of the word-line and the complementary word-line in a write operation of the storage circuit of FIG. 2 according to example embodiments. Referring to FIGS. 2 and 4, the control circuit 140 may perform the write operation to store the data bit provided through the bit-line BL in the first storage node SN1 and the third storage node SN3 by enabling the word-line WL with a logic high level VCC to turn on the first NMOS access transistor 133a during a first time interval from a first time point T11 to a second time point T12, and by enabling the complementary word-line WLB with a logic low level VSS to turn on the first PMOS access transistor 131a during a second time interval from a third time point T13 to the second time point T12. The third time point T13 may be between the first time point T11 and the second time point T12. Advantageously, when the complementary word-line WLB is enabled with a delay with respect to the word-line WL, data flipping may be prevented, which may occur when the word-line WL is shared.

Figure 5:
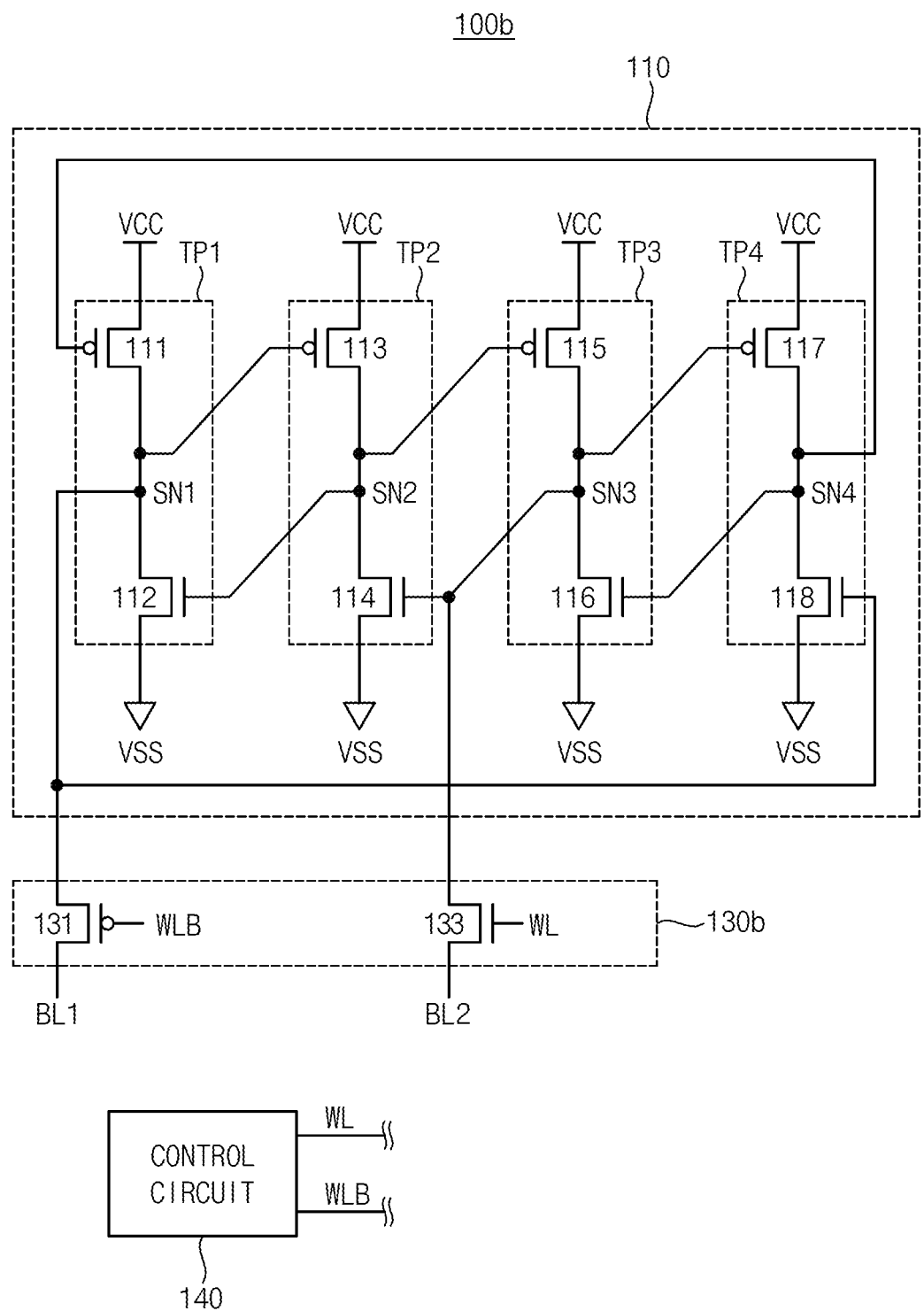
FIG. 5 is a circuit diagram illustrating an example of the storage circuit of FIG. 1 according to example embodiments.

FIG. 5 is a circuit diagram illustrating another embodiment of the storage circuit of FIG. 1. Referring to FIG. 5, a storage circuit 100b may include a latch circuit 110, an access circuit 130b and a control circuit 140. The latch circuit 110 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage. Configuration and operation of the latch circuit 110 and the control circuit 140, previously described with respect to FIG. 1, will be omitted.

The access circuit 130b may include a first PMOS access transistor 131 and a first NMOS access transistor 133. The first PMOS access transistor 131 may have a source connected to the first storage node SN1, a gate connected to the complementary word-line WLB and a drain connected to a first bit-line BL1. The first NMOS access transistor 133 may have a source connected to the third storage node SN3, a gate connected to the word-line WL and a drain connected to a second bit-line BL2.

The control circuit 140, in a write operation, may store data bits in the first storage node SN1 and the third storage node SN3 based on a first data bit provided through the first bit-line BL1 and the second bit-line BL2, by turning on the first PMOS access transistor 131 and the first NMOS access transistor 133 by adjusting voltage levels of the complementary word-line WLB and the word-line WL. In addition, during a read operation, a data bit stored in the third storage node SN3 may be read through the second bit-line BL2 by turning off the first PMOS access transistor 131 and by turning on the first NMOS access transistor 133 by adjusting voltage levels of the complementary word-line WLB and the word-line WL.

Figure 6:
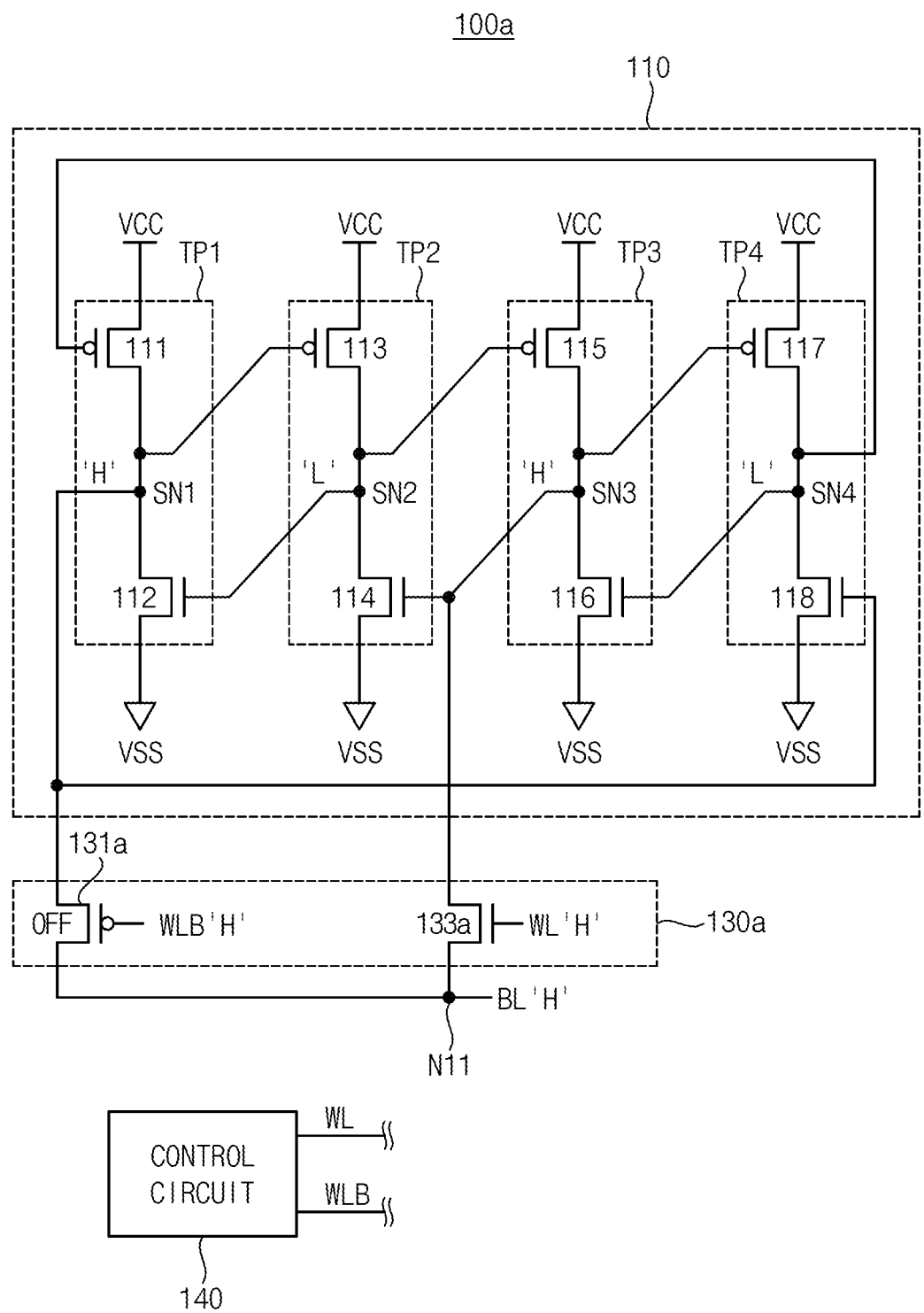
FIG. 6 illustrates a read operation of the storage circuit of FIG. 2 according to example embodiments.

FIG. 6 illustrates a read operation of the storage circuit of FIG. 2 according to example embodiments. In FIG. 6, assuming that a data bit having a logic high level 'H' is stored in the first storage node SN1 and the third storage node SN3 and a data bit having a logic low level is stored in the second storage node SN2 and the fourth storage node SN4. Referring to FIG. 6, for performing a read operation, when the control circuit 140 turns off the first PMOS access transistor 131a by applying a voltage with a high level 'H' to the complementary word-line WLB and turns on the first NMOS access transistor 133a by applying a voltage with a high level 'H' to the word-line WL after the bit-line BL is precharged with a high level 'H', the data bit having a logic high level 'H' stored in the third storage node SN3 is read through the bit-line BL.

Figure 7:
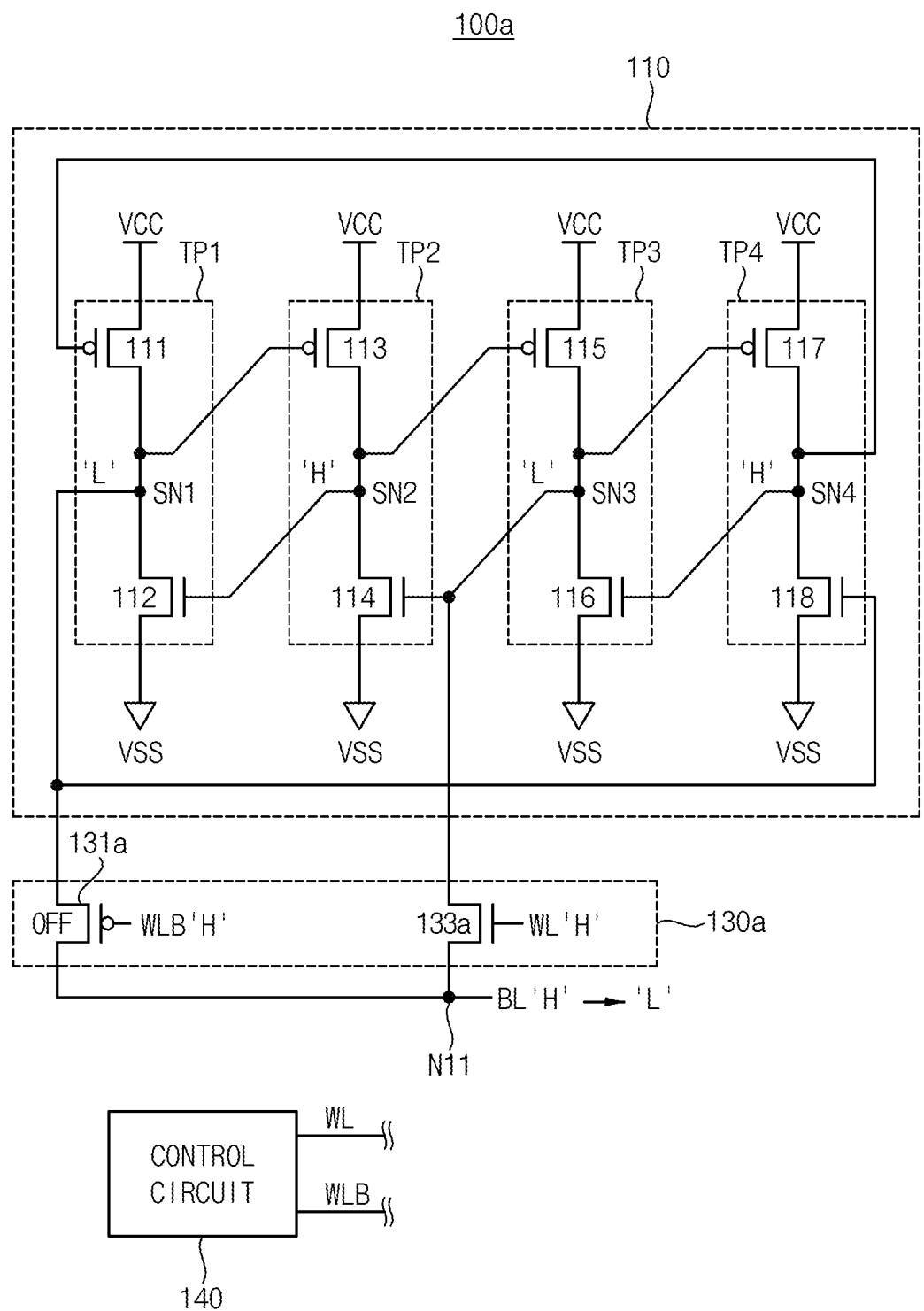
FIG. 7 illustrates a read operation of the storage circuit of FIG. 2 according to example embodiments.

FIG. 7 illustrates a read operation of the storage circuit of FIG. 2 according to example embodiments. In FIG. 7, assuming that a data bit having a logic low level is stored in the first storage node SN1 and the third storage node SN3 and a data bit having a logic high level 'H' is stored in the second storage node SN2 and the fourth storage node SN4. Referring to FIG. 7, for performing a read operation, when the control circuit 140 turns off the first PMOS access transistor 131a by applying a voltage with a high level 'H' to the complementary word-line WLB and turns on the first NMOS access transistor 133a by applying a voltage with a high level 'H' to the word-line WL after the bit-line BL is precharged with a high level 'H', the bit-line has a voltage level with high level 'H'. Because the first PMOS access transistor 131a is turned off, a voltage level of the first storage node SN1 is maintained with a low level without regard to the high level 'H' of the bit-line BL and the voltage level of the third storage node SN3 is maintained with a low level 'L', and thus, the voltage level of the bit-line BL may transit to a low level from a high level 'H'.

If the first PMOS access transistor 131a is turned on, a data flipping in which a voltage level of the first storage node SN1 transits to a high level due to the voltage level of the bit-line BL having a high level 'H' and a voltage level of the third storage node SN3 transits to a high level due to the voltage level of the first storage node SN1. However, the storage circuit 100a according to example embodiments may prevent the data flipping by turning off the first PMOS access transistor 131a during the read operation.

Figure 8:
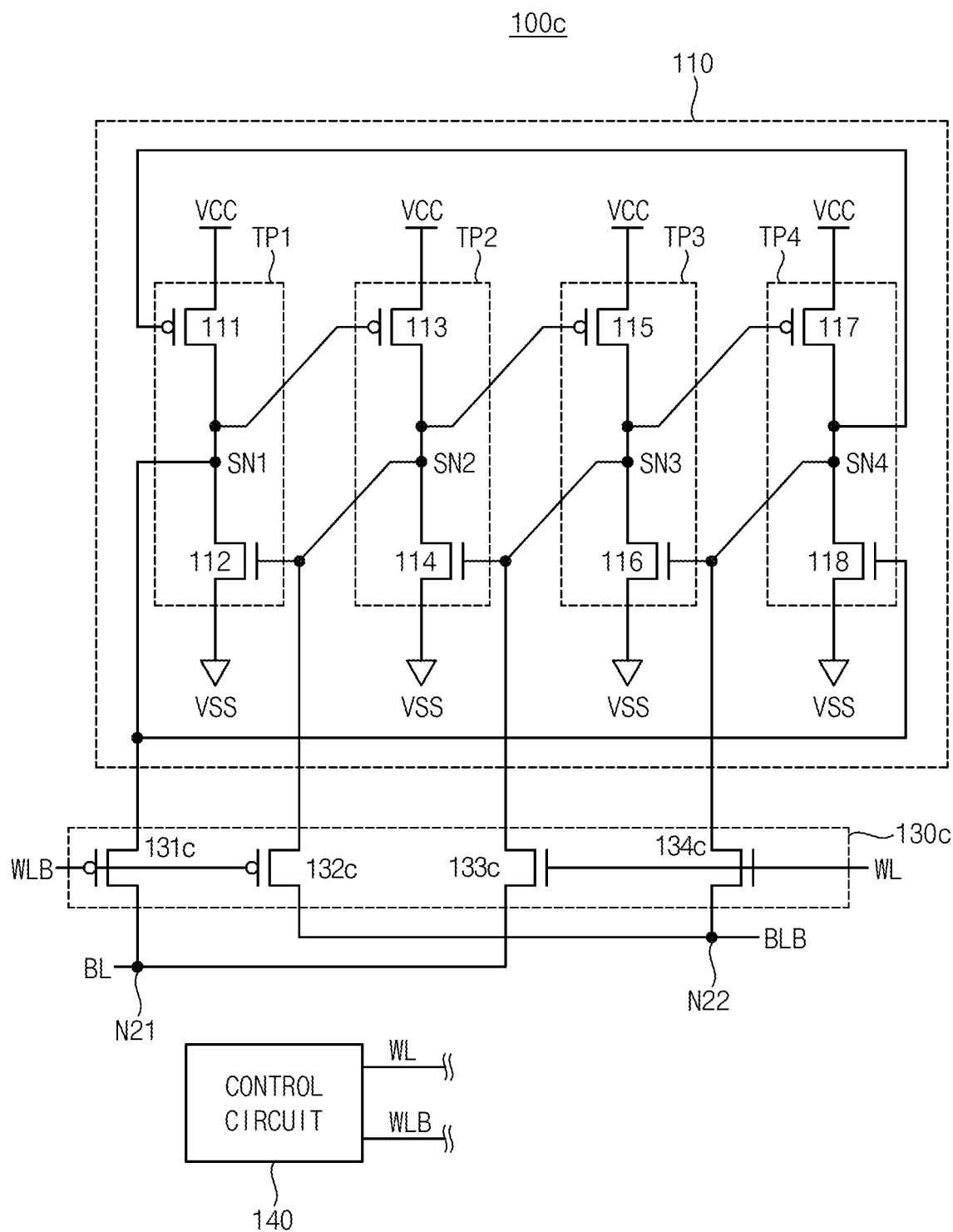
FIG. 8 is a circuit diagram illustrating an example of the storage circuit of FIG. 1 according to example embodiments.

FIG. 8 is a circuit diagram illustrating an example of the storage circuit of FIG. 1 according to example embodiments. Referring to FIG. 8, a storage circuit 100c may include a latch circuit 110, an access circuit 130c and a control circuit 140. The latch circuit 110 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of the first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage. Configuration and operation of the latch circuit 110 and the control circuit 140, previously described with respect to FIG. 1, will be omitted.

The access circuit 130c may include a first PMOS access transistor 131c, a second PMOS access transistor 132c, a first NMOS access transistor 133c and a second NMOS access transistor 134c. The first PMOS access transistor 131c may have a source connected to the first storage node SN1, a gate connected to a complementary word-line WLB and a drain connected to a bit-line BL. The second PMOS access transistor 132c may have a source connected to the second storage node SN2, a gate connected to the complementary word-line WLB and a drain connected to a complementary bit-line BLB. The first NMOS access transistor 133c may have a source connected to the third storage node SN3, a gate connected to the word-line WL, and a drain connected to the bit-line BL. The second NMOS access transistor 134c may have a source connected to the fourth storage node SN4, a gate connected to the word-line WL and a drain connected to the complementary bit-line BLB.

The control circuit 140, during a write operation, may store data bits in the first to fourth storage nodes SN1, SN2, SN3 and SN4 based on data bits provided through the bit-line BL and the complementary bit-line BLB, by turning on the first PMOS access transistor 131c, the second PMOS access transistor 132c, the first NMOS access transistor 133c and the second NMOS access transistor 134c, by adjusting voltage levels of the complementary word-line WLB and the word-line WL. In addition, during a read operation, data bits stored in the third storage node SN3 and the fourth storage node SN4 may be read through the bit-line BL and the complementary bit-line BLB by turning off the first PMOS access transistor 131c and the second PMOS access transistor 132c and by turning on the first NMOS access transistor 133c and the second NMOS access transistor 134c and by adjusting voltage levels of the complementary word-line WLB and the word-line WL.

Because the access circuit 130c includes the first PMOS access transistor 131a, the second PMOS access transistor 132c, the first NMOS access transistor 133c and the second NMOS access transistor 134c and the access circuit 130c access two or four storage nodes of the first to fourth storage nodes SN1, SN2, SN3 and SN4, the latch circuit 110 and the access circuit 130c in FIG. 8 may be referred to as a complementary DICE.

Figure 9:
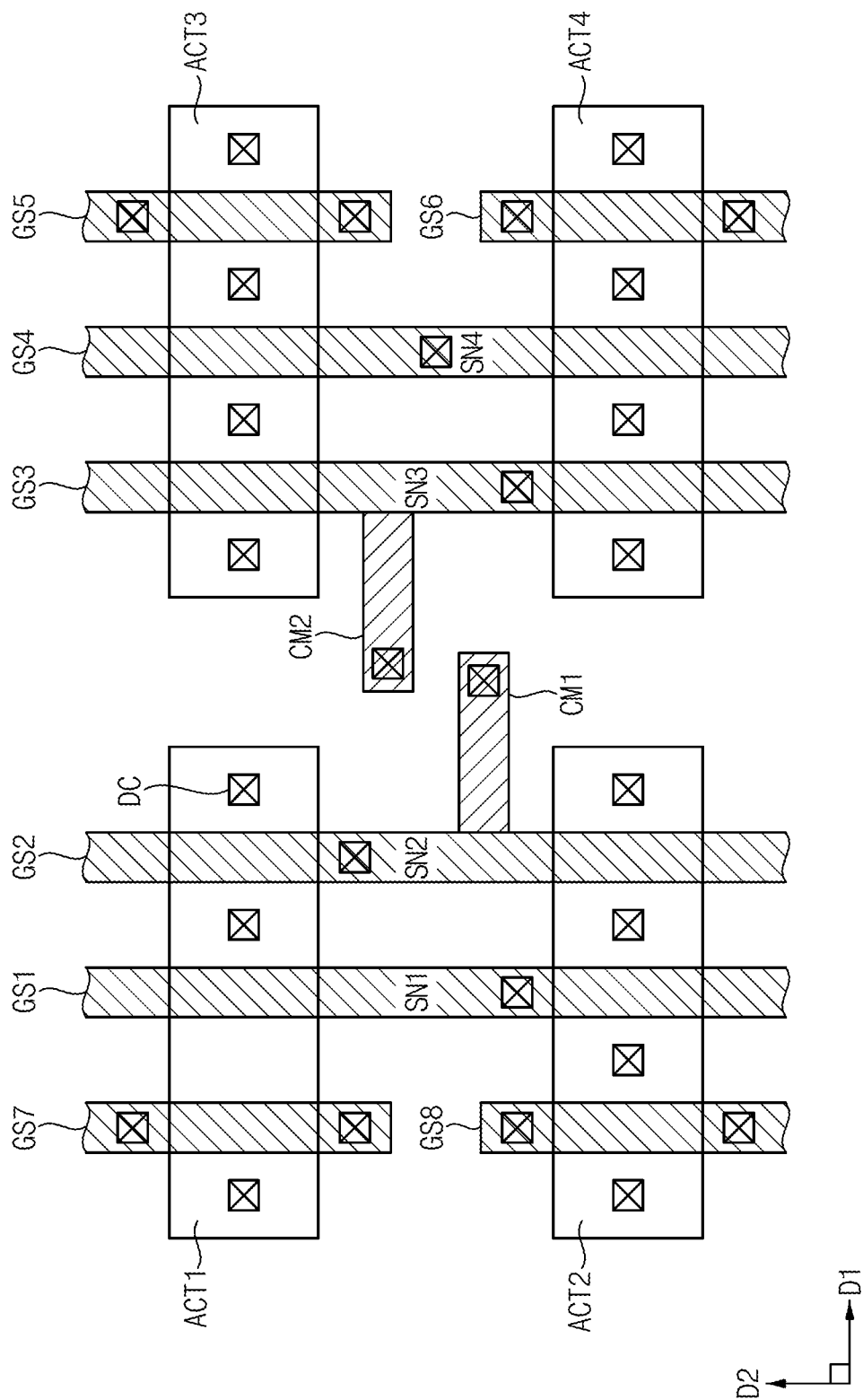
FIG. 9 illustrates an example layout of the latch circuit and the access circuit in the storage circuit of FIG. 8 according to example embodiments.

FIG. 9 illustrates an example layout of the latch circuit and the access circuit in the storage circuit of FIG. 8 according to example embodiments. Referring to FIGS. 8 and 9, the first transistor pair TP1 and the second transistor pair TP2 may be provided by (or may include) a first active pattern ACT1 and a second active pattern ACT2 which extend in a first direction D1 and are spaced apart from each other in a second direction D2 crossing the first direction D1, and a first gate pattern GS1 and a second gate pattern GS2 which are provided on the first active pattern ACT1 and the second active pattern ACT2. The first gate pattern GS1 and the second gate pattern GS2 may extend in the second direction D2 and may be spaced apart from each other in the first direction D1.

The third transistor pair TP3 and the fourth transistor pair TP4 may be provided by (or may include) a third active pattern ACT3 and a fourth active pattern ACT4 which extend in the first direction D1 and are spaced apart from each other in the second direction D2 and a third gate pattern GS3 and a fourth gate pattern GS4 provided on the third active pattern ACT3 and the fourth active pattern ACT4. The third active pattern ACT3 may be spaced apart from the first active pattern ACT1 in the first direction D1 and the fourth active pattern ACT4 may be spaced apart from the second active pattern ACT2 in the first direction D1. The third gate pattern GS3 and the fourth gate pattern GS4 extend in the second direction D2 and may be spaced apart from each other in the first direction D1.

In addition, the first PMOS access transistor 131c may be provided by the third active pattern GS3 and a fifth gate pattern GS5 provided on the third active pattern ACT3, which is spaced apart from the fourth gate pattern GS4 in the first direction D1 and extends in the second direction D2. The first NMOS access transistor 133c may be provided by the fourth active pattern GS4 and a sixth gate pattern GS6 provided on the fourth active pattern ACT4, which is spaced apart from the fourth gate pattern GS4 in the first direction D1, is spaced apart from the fifth gate pattern GS5 in the second direction D2 and extends in the second direction D2.

In addition, the second PMOS access transistor 132c may be provided by the first active pattern GS1 and a seventh gate pattern GS7 provided on the first active pattern ACT1, which is spaced apart from the first gate pattern GS1 in the first direction D1 and extends in the second direction D2. The second NMOS access transistor 134c may be provided by the second active pattern ACT2 and an eighth gate pattern GS8 provided on the second active pattern ACT2, which is spaced apart from the first gate pattern GS1 in the first direction D1, is spaced apart from the first gate pattern GS1 in the second direction D2 and extends in the second direction D2. The gate of the NMOS transistor 114 and the third storage node SN3 may be connected to each other by a first connection pattern CM1 extending in the first direction D1 from the second gate pattern GS2 and a second connection pattern CM2 extending in the first direction D1 from the third gate pattern GS3.

A direct contact DC for connecting another pattern may be formed in each of the first gate pattern GS1, the second gate pattern GS2, the third gate pattern GS3, the fourth gate pattern GS4, the fifth gate pattern GS5, the sixth gate pattern GS6, the seventh gate pattern GS7 and the eighth gate pattern GS8 and in each of the first active pattern ACT1, the second active pattern ACT2, the third active pattern ACT3 and the fourth active pattern ACT4.

In addition, each of the first storage node SN1, the second storage node SN2, the third storage node SN3 and the fourth storage node SN4 may be provided in respective one of the first gate pattern GS1, the second gate pattern GS2, the third gate pattern GS3 and the fourth gate pattern GS4.

The first gate pattern GS1, the second gate pattern GS2, the third gate pattern GS3, the fourth gate pattern GS4, the fifth gate pattern GS5 and the sixth gate pattern GS6 may extend in the second direction D2 and may be arranged in parallel in the first direction D1. The first gate pattern GS1 and the first active pattern ACT1 may correspond to the PMOS transistor 111 and the first gate pattern GS1 and the second active pattern ACT2 may correspond to the NMOS transistor 112. The second gate pattern GS2 and the first active pattern ACT1 may correspond to the PMOS transistor 113 and the second gate pattern GS2 and the second active pattern ACT2 may correspond to the NMOS transistor 114.

The third gate pattern GS3 and the third active pattern ACT3 may correspond to the PMOS transistor 115 and the third gate pattern GS3 and the fourth active pattern ACT4 may correspond to the NMOS transistor 116. The fourth gate pattern GS4 and the third active pattern ACT3 may correspond to the PMOS transistor 117 and the fourth gate pattern GS4 and the fourth active pattern ACT4 may correspond to the NMOS transistor 118.

The fifth gate pattern GS5 and the third active pattern ACT3 may correspond to the first PMOS access transistor 131c and the sixth gate pattern GS6 and the fourth active pattern ACT4 may correspond to the first NMOS access transistor 133c. The seventh gate pattern GS7 and the first active pattern ACT1 may correspond to the second PMOS access transistor 132c and the eighth gate pattern GS8 and the second active pattern ACT2 may correspond to the second NMOS access transistor 134c.

The complementary word-line WLB and the bit-line BL may be connected to the direct contacts DC on the fifth gate pattern GS5 and the word-line WL and the complementary bit-line BLB may be connected to the direct contacts DC on the sixth gate pattern GS6. The complementary word-line WLB and the complementary bit-line BLB may be connected to the direct contacts DC on the seventh gate pattern GS7 and the word-line WL and the complementary bit-line BLB may be connected to the direct contacts DC on the eighth gate pattern GS8.

Figure 10:
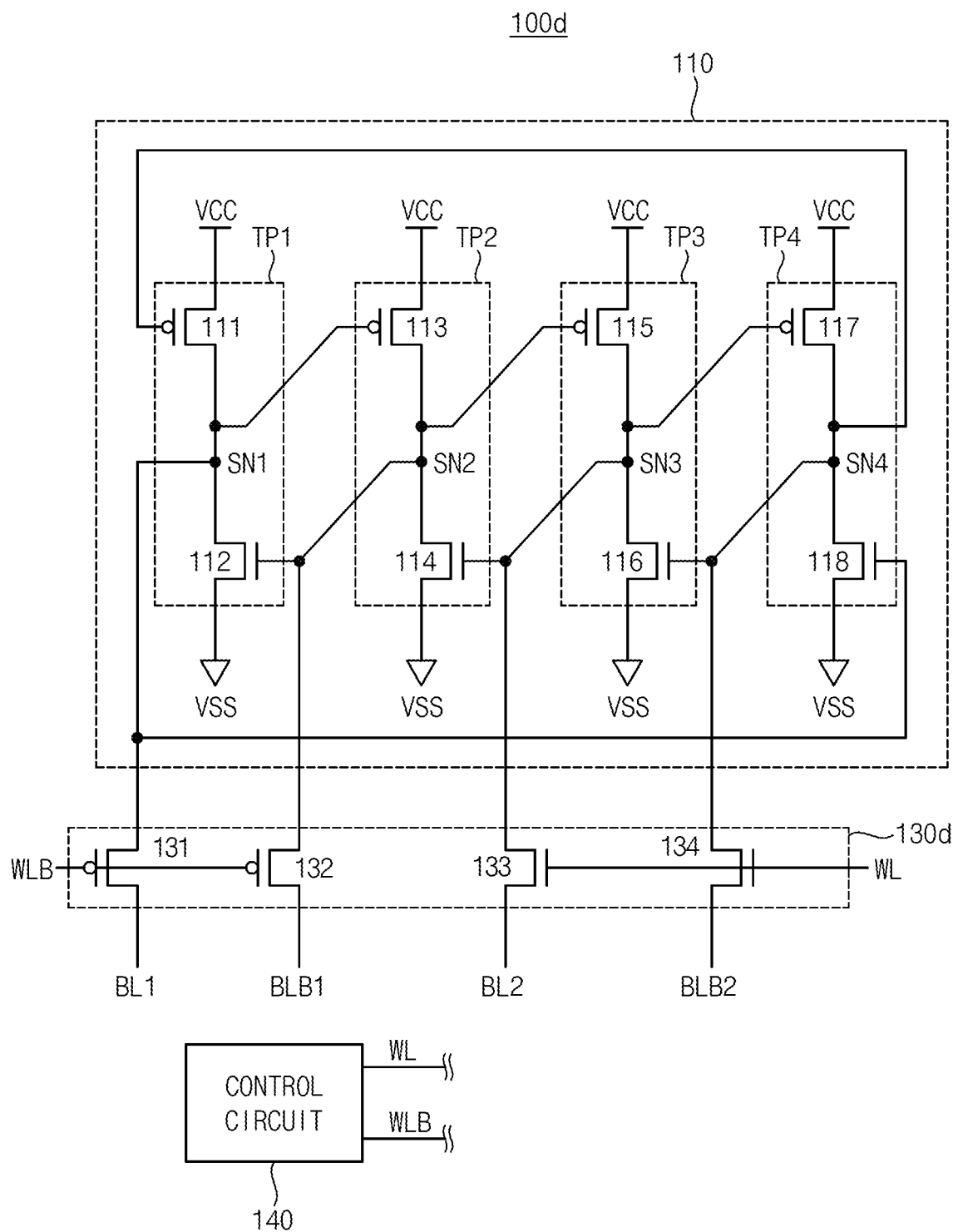
FIG. 10 is a circuit diagram illustrating an example of the storage circuit of FIG. 1 according to example embodiments.

FIG. 10 is a circuit diagram illustrating an example of the storage circuit of FIG. 1 according to example embodiments. Referring to FIG. 10, a storage circuit 100d may include a latch circuit 110, an access circuit 130d and a control circuit 140. The latch circuit 110 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of the first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage. Configuration and operation of the latch circuit 110 and the control circuit 140, previously described with respect to FIG. 1, will be omitted.

The access circuit 130d may include a first PMOS access transistor 131, a second PMOS access transistor 132, a first NMOS access transistor 133 and a second NMOS access transistor 134. The first PMOS access transistor 131 may have a source connected to the first storage node SN1, a gate connected to a complementary word-line WLB and a drain connected to a first bit-line BL1. The second PMOS access transistor 132 may have a source connected to the second storage node SN2, a gate connected to the complementary word-line WLB and a drain connected to a first complementary bit-line BLB1. The first NMOS access transistor 133 may have a source connected to the third storage node SN3, a gate connected to a word-line WL and a drain connected to a second bit-line BL2. The second NMOS access transistor 134 may have a source connected to the fourth storage node SN4, a gate connected to the word-line WL and a drain connected to a second complementary bit-line BLB2.

Figure 11:
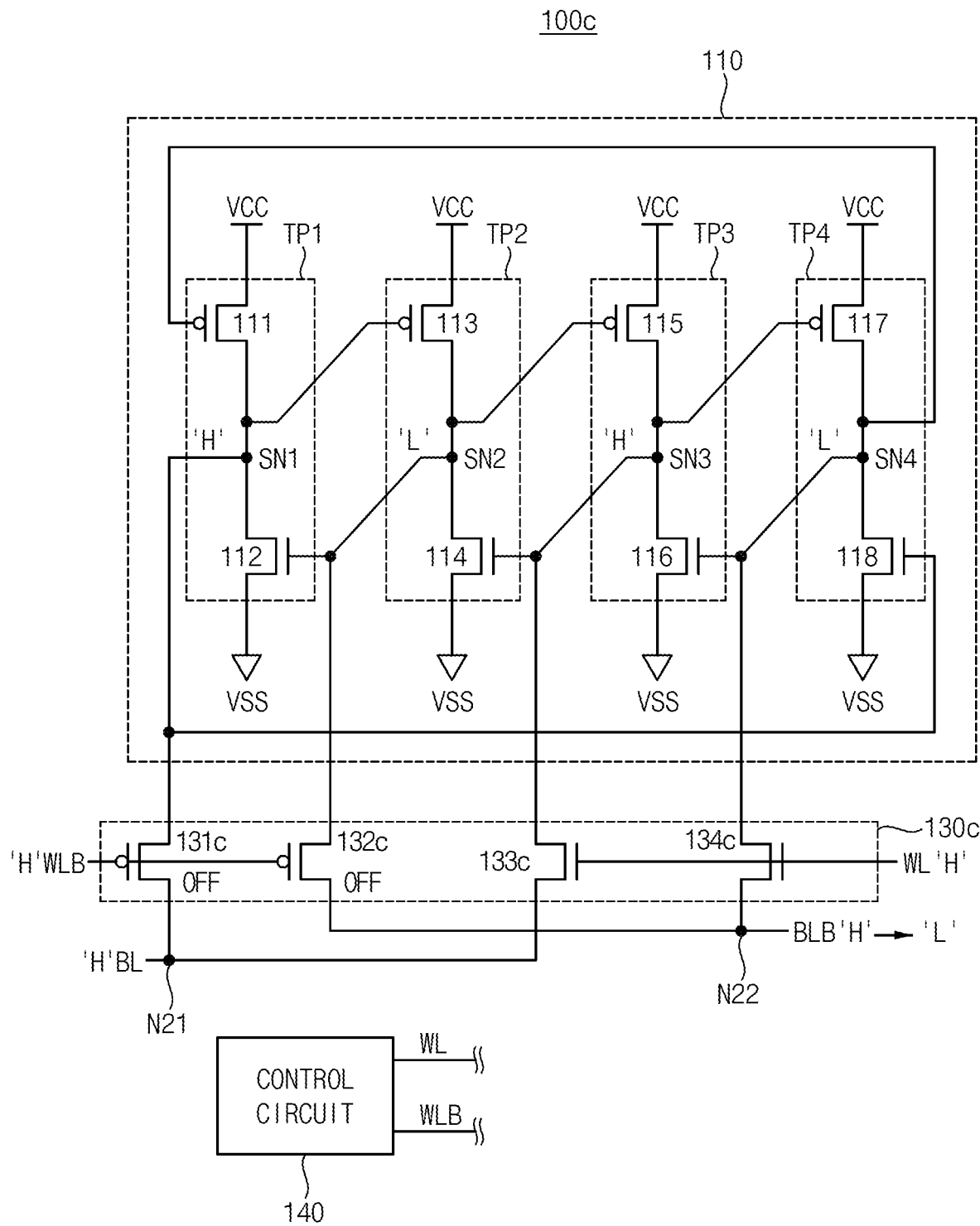
FIG. 11 illustrates a read operation of the storage circuit of FIG. 8 according to example embodiments.

FIG. 11 illustrates a read operation of the storage circuit 100c of FIG. 8 according to example embodiments. In FIG. 11, assuming that a data bit having a logic high level 'H' is stored in the first storage node SN1 and the third storage node SN3 and a data bit having a logic low level is stored in the second storage node SN2 and the fourth storage node SN4. Referring to FIG. 11, when performing a read operation, the bit-line BL and the complementary bit-line BLB are precharged with a high level 'H', a voltage level of the complementary bit-line BLB has a high level CH.

When the control circuit 140 turns off the first PMOS access transistor 131c and the second PMOS access transistor 132c by applying a voltage with a high level 'H' to the complementary word-line WLB and turns on the first NMOS access transistor 133c and the second NMOS access transistor 134d by applying a voltage with a high level 'H' to the word-line WL, the data bit having a logic high level 'H' stored in the third storage node SN3 is read through the bit-line BL and the data bit having a logic low level stored in the fourth storage node SN4 is read through the complementary bit-line BLB.

The access circuit 130c may prevent a voltage level of the second storage node SN2 from being affected by the high level 'H' of the complementary bit-line BLB by turning off the first PMOS access transistor 131c and the second PMOS access transistor 132c, and a voltage level of the fourth storage node SN4 transits to low level from a high level CH.

Figure 12:
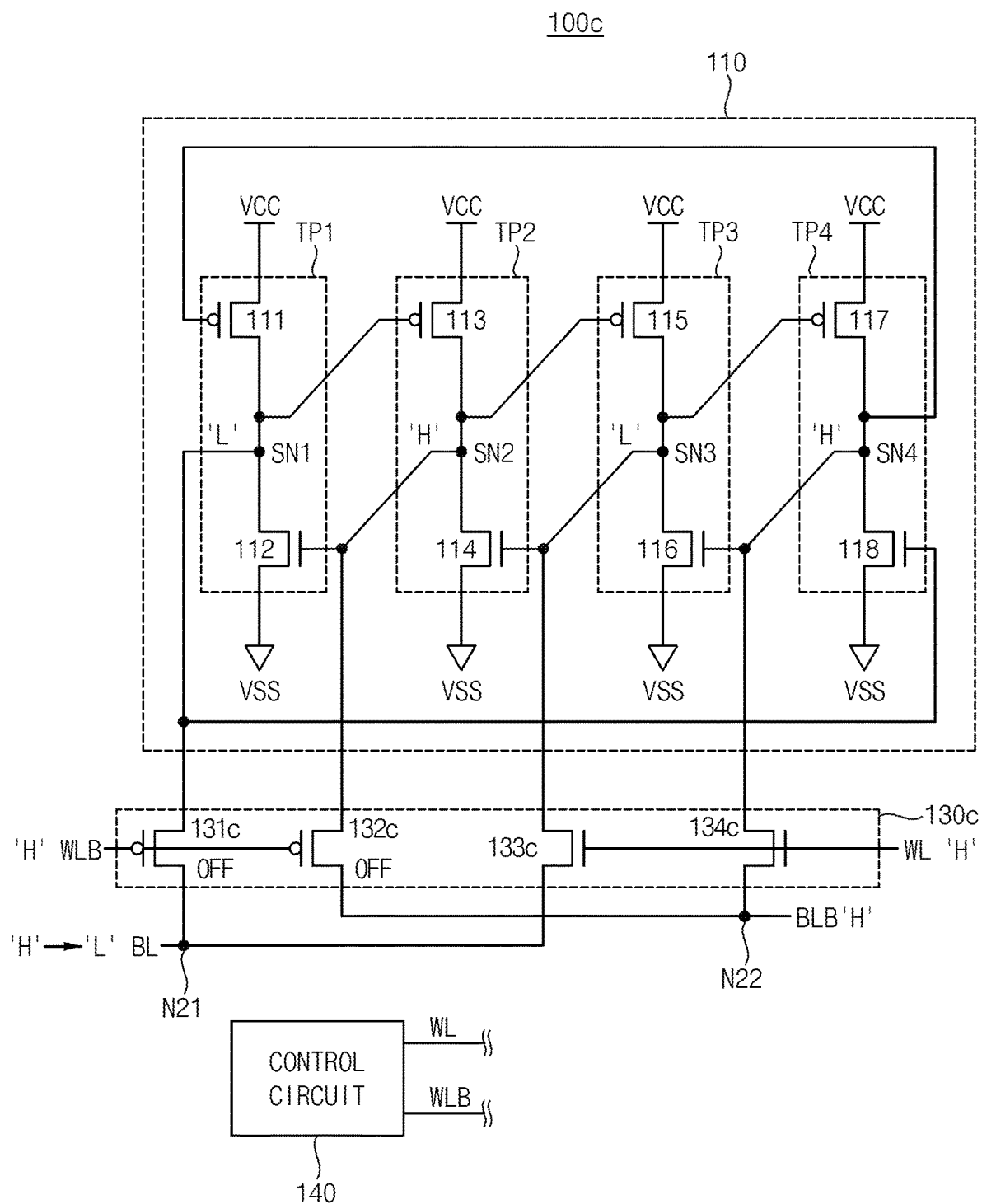
FIG. 12 illustrates a read operation of the storage circuit of FIG. 8 according to example embodiments.

FIG. 12 illustrates a read operation of the storage circuit of FIG. 8 according to example embodiments. In FIG. 12, assuming that a data bit having a logic low level is stored in the first storage node SN1 and the third storage node SN3 and a data bit having a logic high level 'H' is stored in the second storage node SN2 and the fourth storage node SN4. Referring to FIG. 12, when performing a read operation, the bit-line BL and the complementary bit-line BLB are precharged with a high level 'H', a voltage level of the complementary bit-line BLB has a high level 'H'.

When the control circuit 140 turns off the first PMOS access transistor 131c and the second PMOS access transistor 132c by applying a voltage with a high level 'H' to the complementary word-line WLB and turns on the first NMOS access transistor 133c and the second NMOS access transistor 134d by applying a voltage with a high level 'H' to the word-line WL, the data bit having a logic low level stored in the third storage node SN3 is read through the bit-line BL and the data bit having a logic high level 'H' stored in the fourth storage node SN4 is read through the complementary bit-line BLB.

The access circuit 130c may prevent a voltage level of the first storage node SN1 from being affected by the high level 'H' of the bit-line BL by turning off the first PMOS access transistor 131c and the second PMOS access transistor 132c, and a voltage level of the third storage node SN3 transitions to a low level from a high level 'H'.

Adjusting voltage levels of the word-line WL and the complementary word-line WLB described with reference to FIG. 4 may be applied to a write operation of the storage circuit 100c of FIG. 8.

The control circuit 140 may perform the write operation to store the data bits provided through the bit-line BL and the complementary bit-line BLB in the first to fourth storage nodes SN1, SN2, SN3 and SN4 by enabling the word-line WL with a logic high level to turn on the first NMOS access transistor 133c and the second NMOS access transistor 134c during a first time interval from a first time point to a second time point and by enabling the complementary word-line WLB with a logic low level to turn on the first PMOS access transistor 131c and the second PMOS access transistor 132c during a second time interval from a third time point to the second time point. The third time point may be between the first time point and the second time point.

Figure 13A:
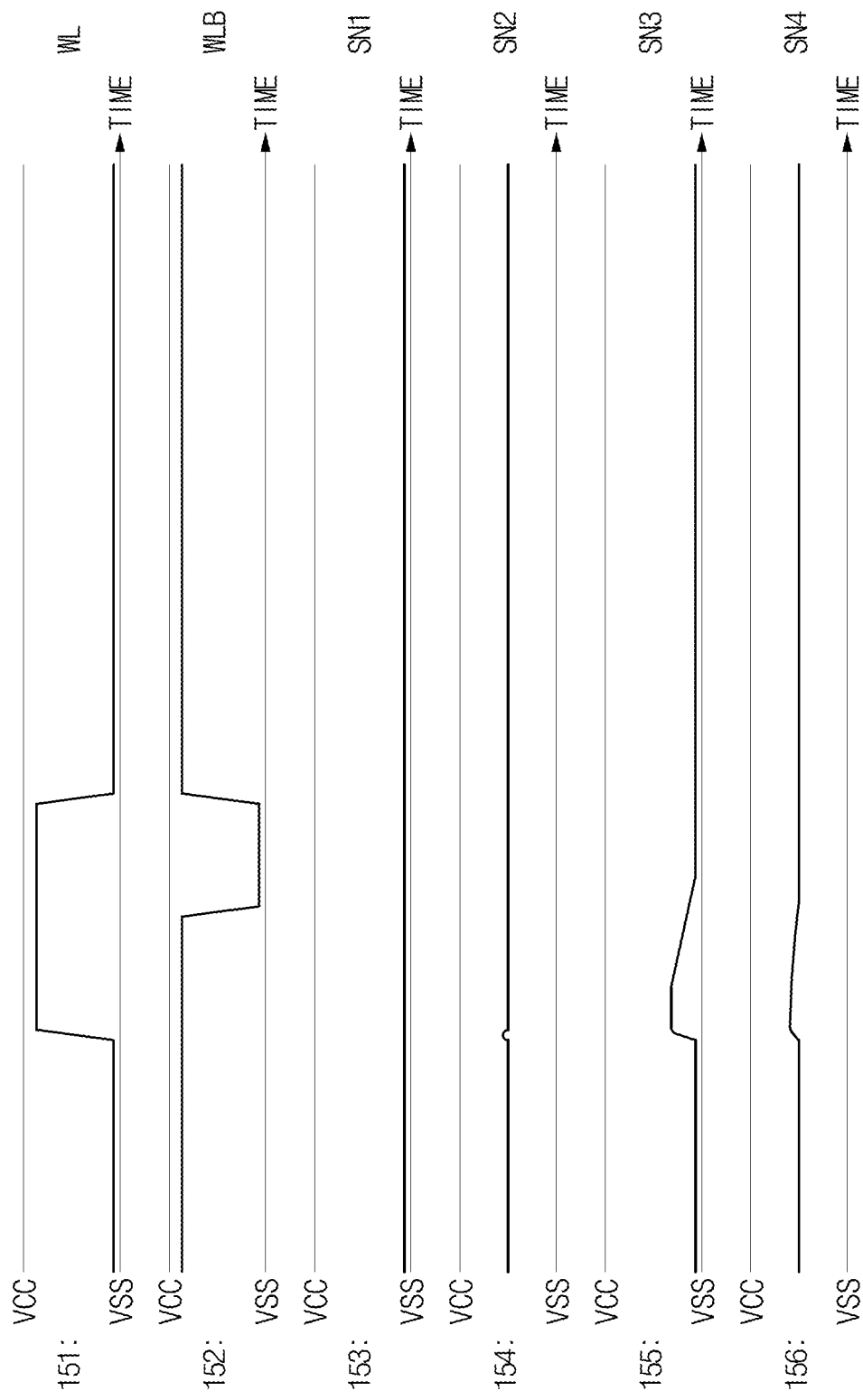
FIG. 13A illustrates waveforms of first to fourth storage nodes when voltage levels of the word-line and the complementary word-line of FIG. 4 are applied to the storage circuit of FIG. 2.

FIG. 13A illustrates waveforms of first to fourth storage nodes when voltage levels of the word-line and the complementary word-line of FIG. 4 are applied to the storage circuit of FIG. 2. In FIG. 13A, a reference numeral 151 denotes a voltage level of the word-line WL, a reference numeral 152 denotes a voltage level of the complementary word-line WLB, a reference numeral 153 denotes a voltage level of the first storage node SN1, a reference numeral 154 denotes a voltage level of the second storage node SN2, a reference numeral 155 denotes a voltage level of the third storage node SN3 and a reference numeral 156 denotes a voltage level of the fourth storage node SN4.

Referring to FIGS. 2, 4 and 13A, when the control circuit 140 turns on the first NMOS access transistor 133a by enabling the word-line WL with a logic high level VCC during the first time interval and turns on the first PMOS access transistor 131a by enabling the complementary word-line WLB with a logic low level VSS during a second time interval, which is delayed with respect to the first time interval and smaller than the first time interval, the voltage level of the third storage node SN3 increases and substantially becomes same as the voltage level of the second storage node SN2.

Figure 13B:
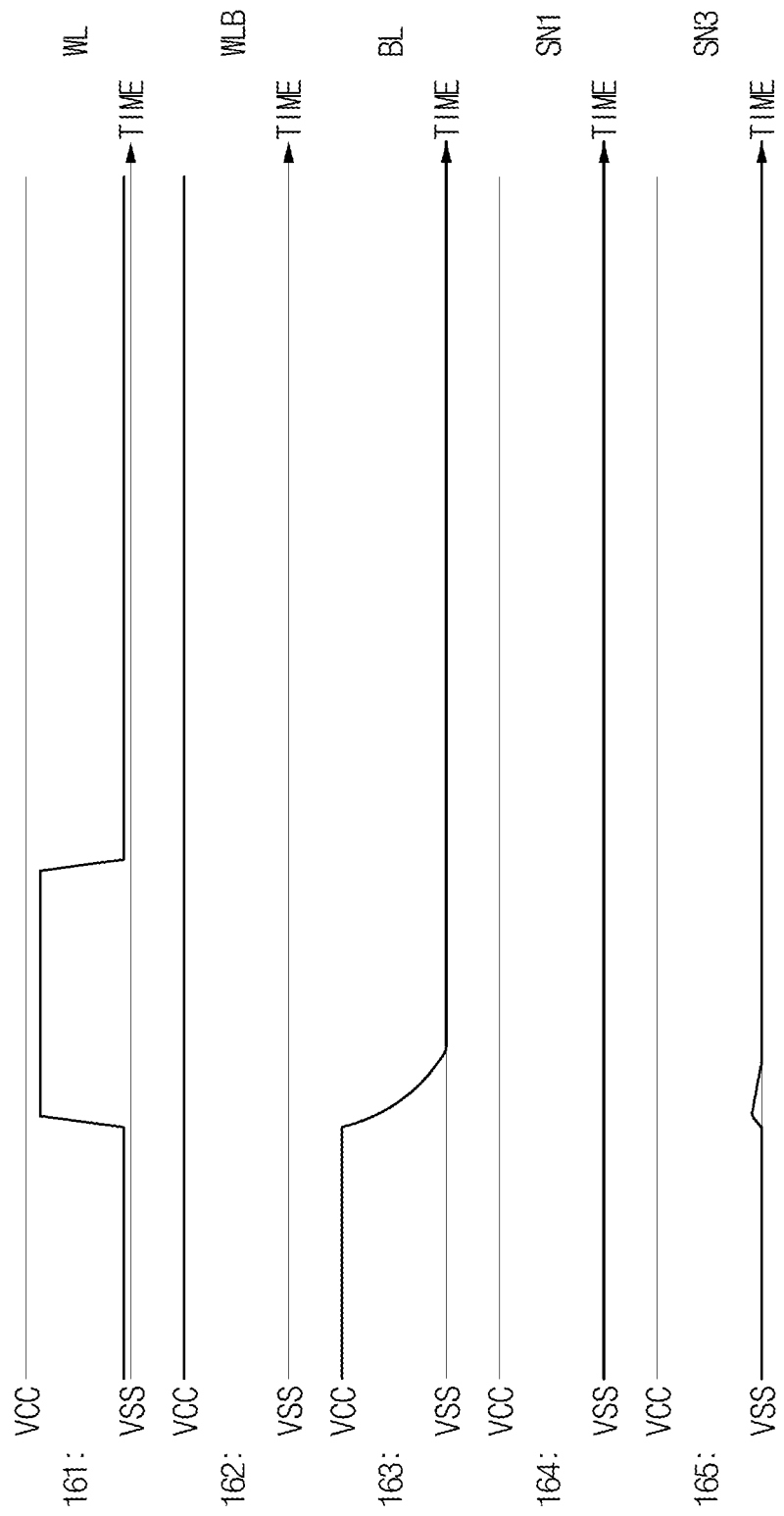
FIG. 13B illustrates waveforms of the complementary word-line, the bit-line, the first storage node and the third storage node when the storage circuit of FIG. 2 performs a read operation by enabling the word-line.

FIG. 13B illustrates waveforms of the complementary word-line, the bit-line, the first storage node and the third storage node when the storage circuit of FIG. 2 performs a read operation by enabling the word-line. In FIG. 13b, a reference numeral 161 denotes a voltage level of the word-line WL, a reference numeral 162 denotes a voltage level of the complementary word-line WLB, a reference numeral 133 denotes a voltage level of the bit-line BL, a reference numeral 164 denotes a voltage level of the first storage node SN1 and a reference numeral 165 denotes a voltage level of the third storage node SN3.

Referring to FIGS. 2, 7 and 13b, when the control circuit 140 turns on the first NMOS access transistor 133a by enabling the word-line WL with a logic high level VCC during an interval and turns off the first PMOS access transistor 131a by enabling the complementary word-line WLB with a logic high level VCC, the voltage level of the first storage node SN1 is maintained with a low level without regard to the high level of the bit-line BL and the voltage level of the third storage node SN3 increases due to high level of the bit-line BL and return to a low level.

The storage circuit 100a of FIG. 2 and the storage circuit 100c separate the word-line WL and the complementary word-line WLB, and thus, may reduce a size of each of the NMOS transistors 112, 114, 116 and 118 in the first to fourth transistor pairs TP1, TP2, TP3 and TP4 and may reduce soft error when a voltage level of the power supply voltage VCC applied to the first to fourth transistor pairs TP1, TP2, TP3 and TP4 varies.

Figure 14:
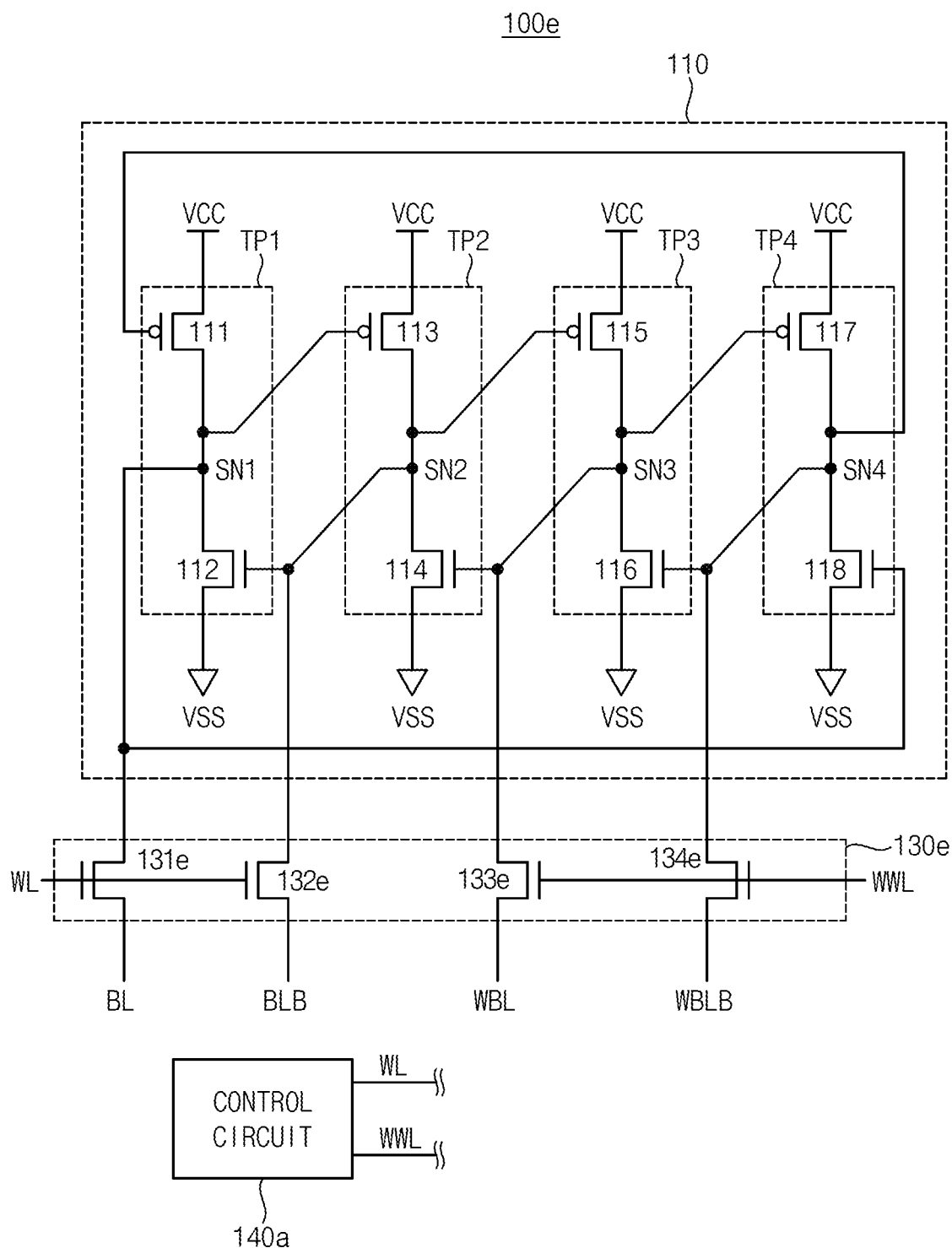
FIG. 14 is a circuit diagram illustrating an example of the storage circuit of FIG. 1 according to example embodiments.

FIG. 14 is a circuit diagram illustrating an example of the storage circuit of FIG. 1 according to example embodiments. Referring to FIG. 14, a storage circuit 100e may include a latch circuit 110, an access circuit 130e and a control circuit 140a. The latch circuit 110 may include first to fourth transistor pairs TP1, TP2, TP3 and TP4. Each of the first to fourth transistor pairs TP1, TP2, TP3 and TP4 may include a PMOS transistor and an NMOS transistor connected in series through a corresponding one of the first to fourth storage nodes SN1, SN2, SN3 and SN4. Each of the first to fourth storage nodes SN1, SN2, SN3 and SN4 may be connected to a gate of an NMOS transistor of a transistor pair in a previous stage and a gate of a PMOS transistor of a transistor pair in a next stage. Configuration and operation of the latch circuit 110, previously described with respect to FIG. 1, will be omitted.

The access circuit 130e may include a first NMOS access transistor 131e, a second NMOS access transistor 132e, a third NMOS access transistor 133e and a fourth NMOS access transistor 134e. The first NMOS access transistor 131e may have a source connected to the first storage node SN1, a gate connected to a word-line WL and a drain connected to a bit-line BL. The second NMOS access transistor 132e may have a source connected to the second storage node SN2, a gate connected to the word-line LB and a drain connected to a complementary bit-line BLB. The third NMOS access transistor 133e may have a source connected to the third storage node SN3, a gate connected to a write word-line WWL and a drain connected to a write bit-line WBL. The fourth NMOS access transistor 134e may have a source connected to the fourth storage node SN4, a gate connected to the write word-line WWL and a drain connected to a complementary write bit-line WBLB.

During a write operation, the control circuit 140 may store data bits in the third storage node SN3 and the fourth storage node SN4 based on data bits provided through the write bit-line WBL and the complementary write bit-line WBLB by turning off the first NMOS access transistor 131e and the second NMOS access transistor 132e by applying a voltage having a low level to the word-line WL and by turning on the third NMOS access transistor 133e and the fourth NMOS access transistor 134e by applying a voltage having a high level to the write word-line WWL. When the data bits are stored in the third storage node SN3 and the fourth storage node SN4, a data bit having a same voltage level as the data bit stored in the third storage node SN3 may be stored in the first storage node SN1 and a data bit having a same voltage level as the data bit stored in the fourth storage node SN4 may be stored in the second storage node SN2 due to configuration of the latch circuit 110.

In contrast, during a read operation, the control circuit 140 may read data bits stored in the first storage node SN1 and the second storage node SN2 through the bit-line BL and the complementary bit-line BLB by turning on the first NMOS access transistor 131e and the second NMOS access transistor 132e by applying a voltage having a high level to the word-line WL and by turning off the third NMOS access transistor 133e and the fourth NMOS access transistor 134e by applying a voltage having a low level to the write word-line WWL.

Figure 15:
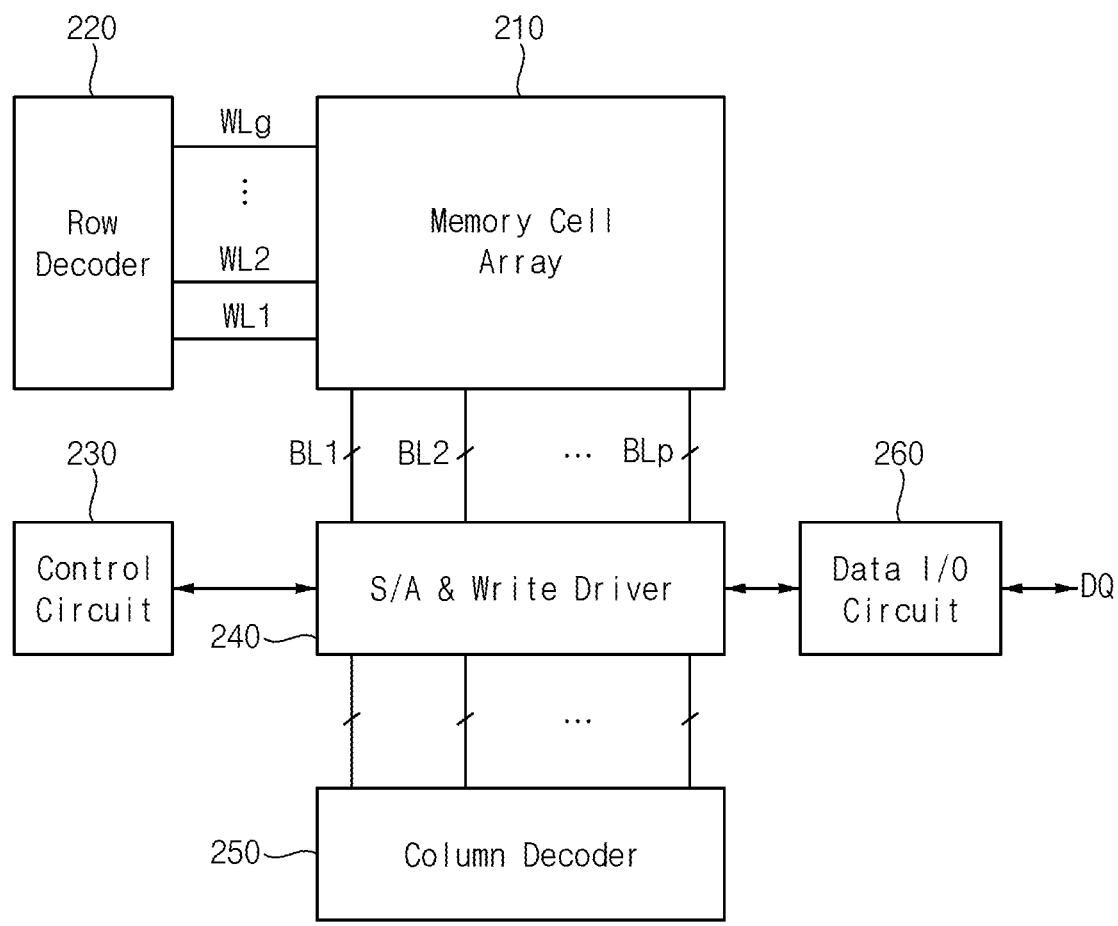
FIG. 15 is a block diagram illustrating a semiconductor memory device according to example embodiments.

FIG. 15 is a block diagram illustrating a semiconductor memory device according to example embodiments. Referring to FIG. 15, a semiconductor memory device 200 may include a memory cell array 210, a row decoder 220, a control circuit 230, a sense amplifier (S/A) and write driver 240, a column decoder 250, and a data input/output (I/O) circuit 260. The semiconductor memory device 200 may be referred to as a semiconductor device.

The memory cell array 210 may include a plurality of word-lines WL1 to WLg (g is an integer greater than or equal to 2), a plurality of bit-lines BL1 to BLp (p is an integer greater than or equal to 2), and a plurality of memory cells for storing data. Each of the memory cells may employ the storage circuit 100 of FIG. 1, and each memory cells may be referred to a DICE latch. Each of the word-lines WL1 to WLg) may include a word-line and a complementary word-line.

The row decoder 220 may decode a row address and may selectively drive one word-line among the word-lines WL1 to WLg) according to a decoding result. The control circuit 230 may control an operation of the sense amplifier and write driver 240 based on a control signal being input from outside the semiconductor memory device 200, for example.

The sense amplifier and write driver 240 may perform a function of a write driver that writes data DQ input through the data input/output circuit 260 to the memory cell array 210 during a write operation. The sense amplifier and write driver 240 may perform a function of a sense amplifier that sense-amplifies data output from the memory cell array 210 and may transmit the amplified data to the data input/output circuit 160.

For example, the sense amplifier and write driver 240 may include a plurality of sense amplifiers respectively configured to sense-amplify data from the bit-lines BL1 to BLp. Each of the sense amplifiers may sense-amplify data of each of the bit-lines BL1 to BLp in response to a control signal output from the control circuit 230. The data sensed by the sense amplifier and write driver 240 may be output as data DQ from the data input/output circuit 260, for example.

Figure 16:
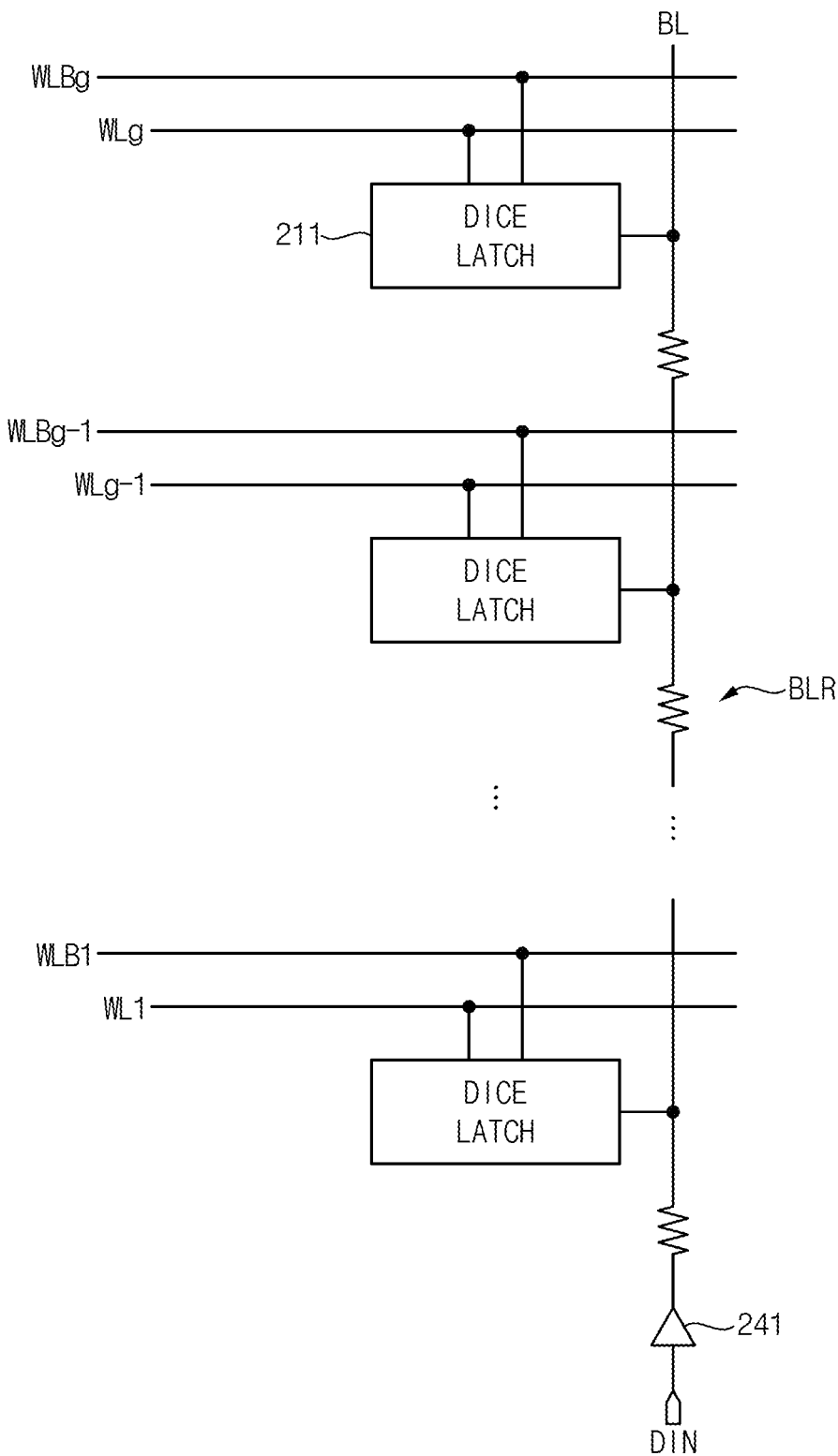
FIG. 16 is a view of a memory cell of a differential word-line structure in a semiconductor memory device of FIG. 15.

FIG. 16 is a view of a memory cell of a differential word-line structure in a semiconductor memory device of FIG. 15. For convenience of description, it is assumed that a memory cell 211 is a DICE latch. Referring to FIG. 16, in the case where bit-line BL increases in length due to an increase of resistance of a metal in a fine process, an output of a write driver may not be properly transmitted to the DICE latch 211 because of a relatively large bit-line resistance BLR.

Figure 17:
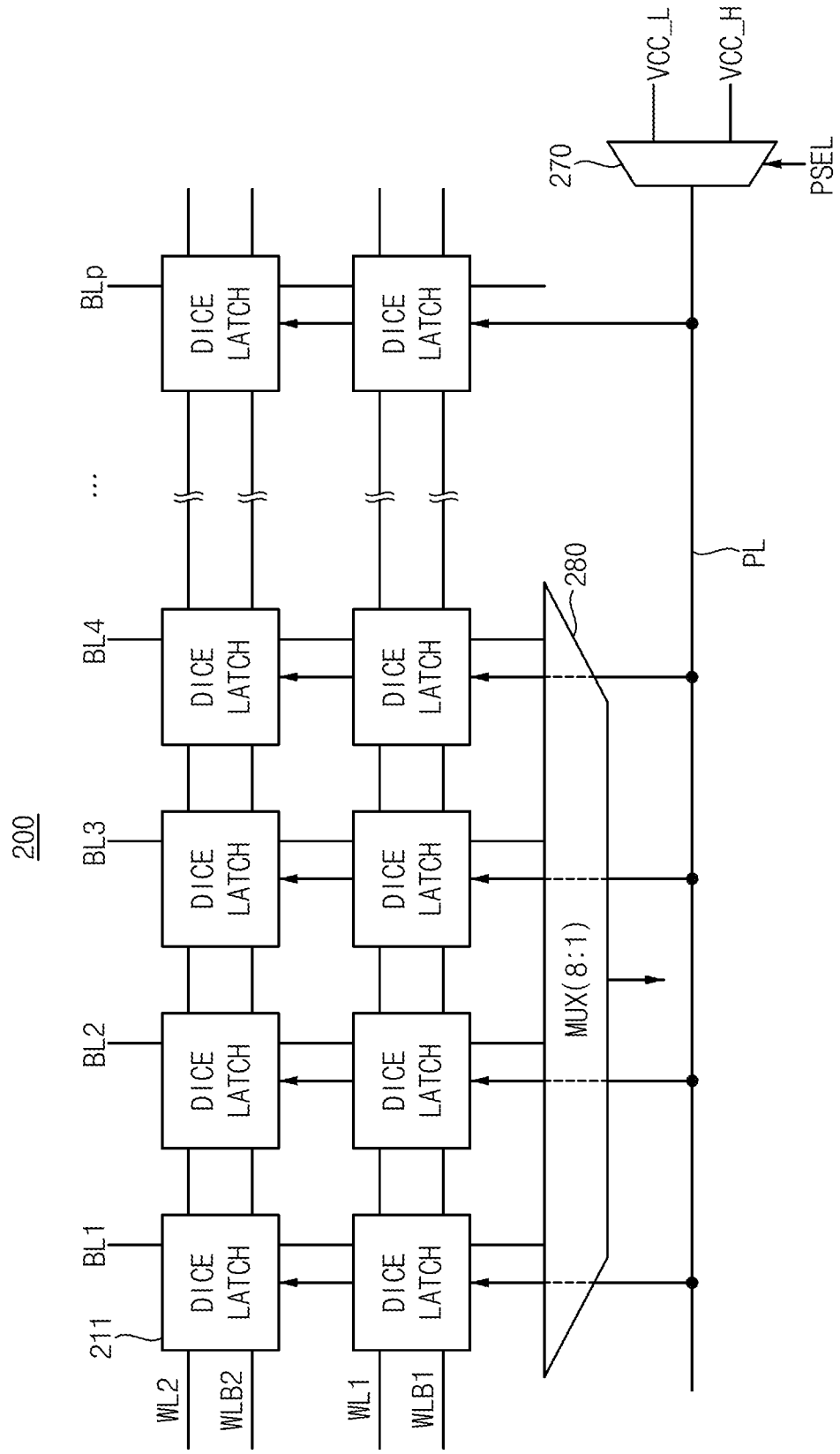
FIG. 17 illustrates a portion of the semiconductor memory device of FIG. 15 according to example embodiments.

FIG. 17 illustrates a portion of the semiconductor memory device of FIG. 15 according to example embodiments. Referring to FIG. 17, the semiconductor memory device 200 may include a plurality of DICE latches 211, a power supply voltage selector 270 and a multiplexer 280. The plurality of DICE latches 211 may be connected to a plurality of bit-lines BL1, BL2, BL3, BL4, . . . , BLp, word-lines WL1 and WL2 and complementary word-line WLB1 and WLB2. Each of the plurality of DICE latches 211 may include the storage circuit 100a of FIG. 2 or may employ the latch circuit 110 and the access circuit 130a in the storage circuit 100a of FIG. 2.

The power supply voltage selector 270 may receive a first power supply voltage VCC_L having a first voltage level and a second power supply voltage VCC_H having a second voltage level greater that the first voltage level, may provide the plurality of DICE latches 211 with the first power supply voltage VCC_L through a power line PL in a write operation and may provide the plurality of DICE latches 211 with the second power supply voltage VCC_H through the power line PL in a read operation, based on a selection signal PSEL. The multiplexer 280 may provide the sense amplifier and write driver 240 with data provided from the DICE latches 211 connected to the bit-lines BL1, BL2, BL3 and BL4, word-lines WL1 and WL2 and complementary word-line WLB1 and WLB2.

Figure 18:
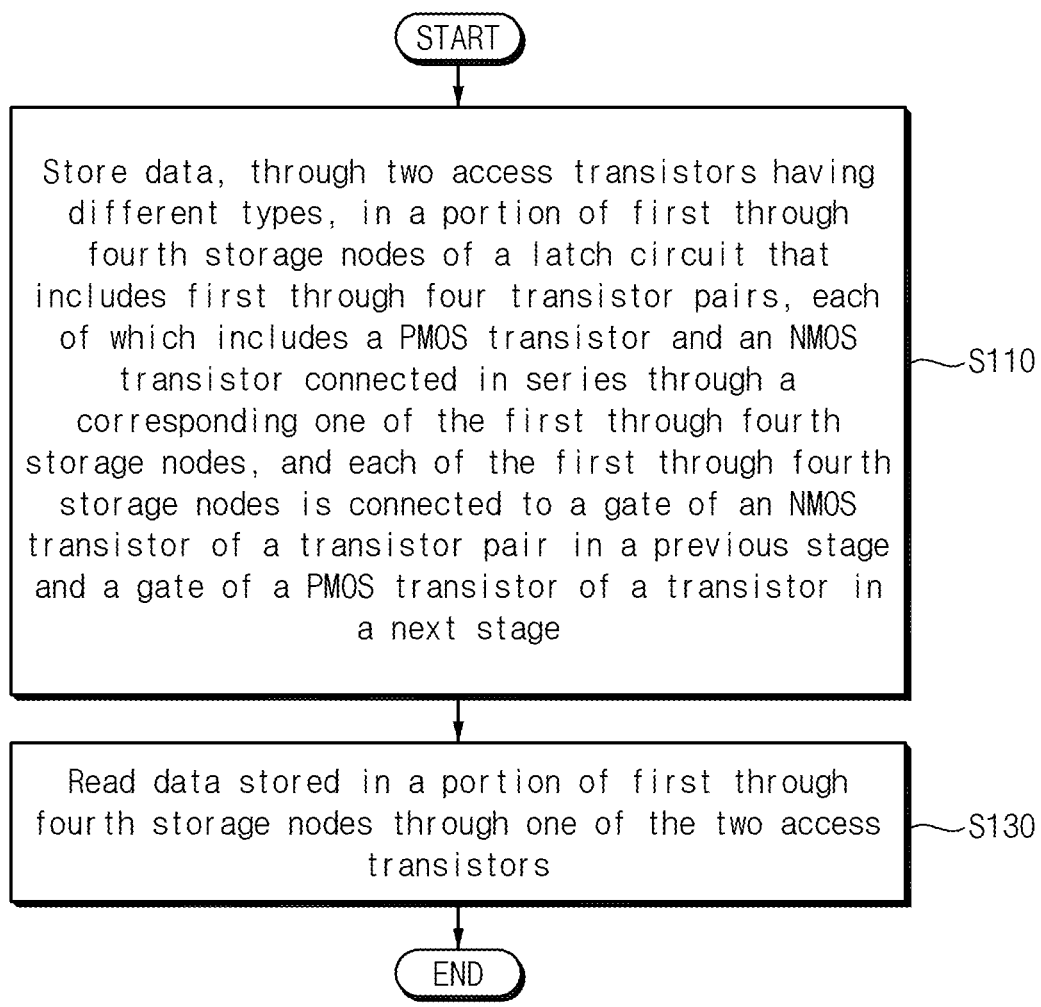
FIG. 18 is a flow chart illustrating a method of operating a storage device according to example embodiments.

FIG. 18 is a flow chart illustrating a method of operating a storage device according to example embodiments. Referring to FIGS. 2 through 4, 6, 7 and 18, data bits are stored, through two access transistors 131a and 133a having different types, in a portion of first through fourth storage nodes SN1, SN2, SN3 and SN4 of a latch circuit 110 that includes first through four transistor pairs TP1, TP2, TP3 and TP4, each of which includes a PMOS transistor and an NMOS transistor connected in series through a corresponding one of the first through fourth storage nodes SN1, SN2, SN3 and SN4, and each of the first through fourth storage nodes SN1, SN2, SN3 and SN4 is connected to a gate of an NMOS transistor of a transistor pair in a previous stage and a gate of a PMOS transistor of a transistor in a next stage (operation S110).

Data bit stored in at least a portion of the first through fourth storage nodes SN1, SN2, SN3 and SN4 is read through one of the two access transistors 131a and 133a (operation S130).

Figure 19:
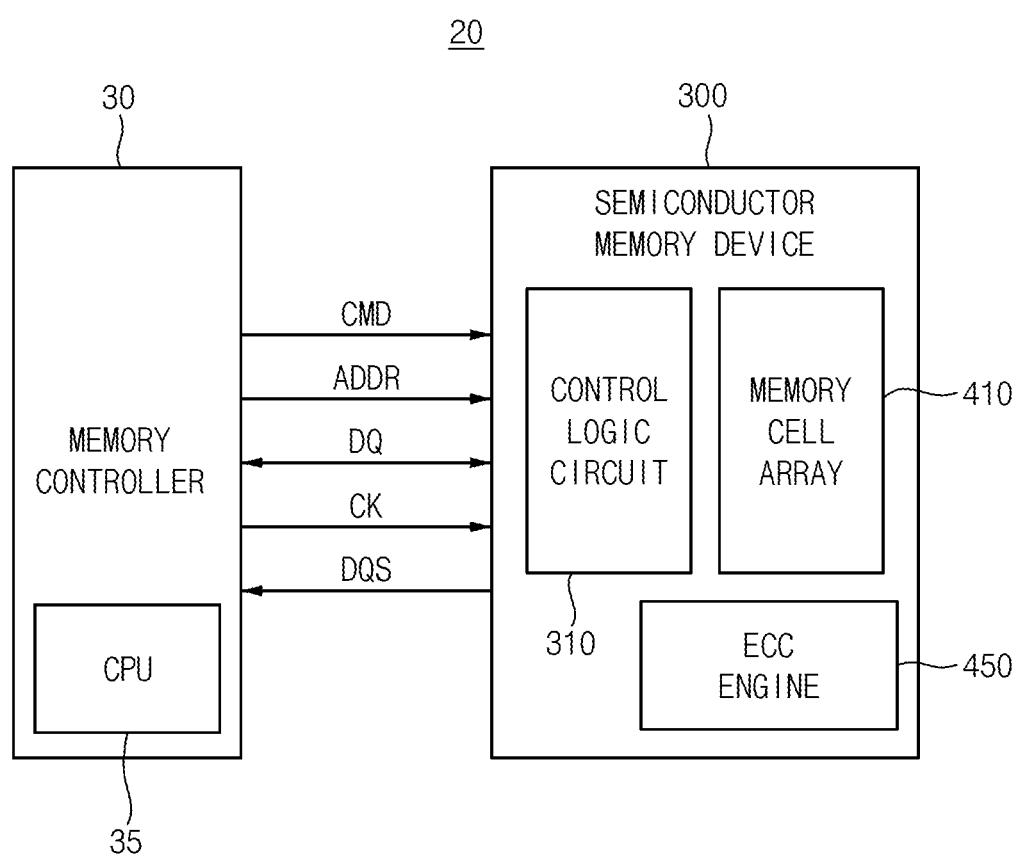
FIG. 19 is a block diagram illustrating a memory system according to example embodiments.

FIG. 19 is a block diagram illustrating a memory system according to example embodiments. Referring to FIG. 19, a memory system 20 may include a memory controller 30 and a semiconductor memory device 300. The memory controller 30 may control overall operation of the memory system 20. The memory controller 30 may control overall data exchange between an external host and the semiconductor memory device 300. For example, the memory controller 30 may write data in the semiconductor memory device 300 or read data from the semiconductor memory device 300 in response to request from the host.

In addition, the memory controller 30 may issue operation commands to the semiconductor memory device 300 for controlling the semiconductor memory device 200. In some example embodiments, the semiconductor memory device 300 is a memory device including dynamic memory cells such as a dynamic random access memory (DRAM), double data rate 5 (DDR5) synchronous DRAM (SDRAM), or a DDR6 SDRAM.

The memory controller 30 transmits a clock signal CK (the clock signal CK may be referred to a command clock signal), a command CMD, and an address (signal) ADDR to the semiconductor memory device 300. The memory controller 30 may receive a data strobe signal DQS from the semiconductor memory device 300 when the memory controller 30 reads data signal DQ from the semiconductor memory device 300. The address ADDR may be accompanied by the command CMD and the address ADDR may be referred to as an access address.

The memory controller 30 may include a central processing unit (CPU) 35 to control overall operation of the memory controller 30. The semiconductor memory device 300 may include a memory cell array 410 that stores the data signal DQ, a control logic circuit 310 and an error correction code (ECC) engine 450. The control logic circuit 310 may control operations of the semiconductor memory device 300. The memory cell array 410 may include a plurality of memory cell rows and each of the memory cell rows may include a plurality of volatile memory cells.

The ECC engine 450 may perform an ECC decoding operation on a write data to be stored in a target page of the memory cell array 410 to generate a parity data and may perform an ECC decoding operation on a data and the parity data read from the target page to correct an error in the read data.

Figure 20:
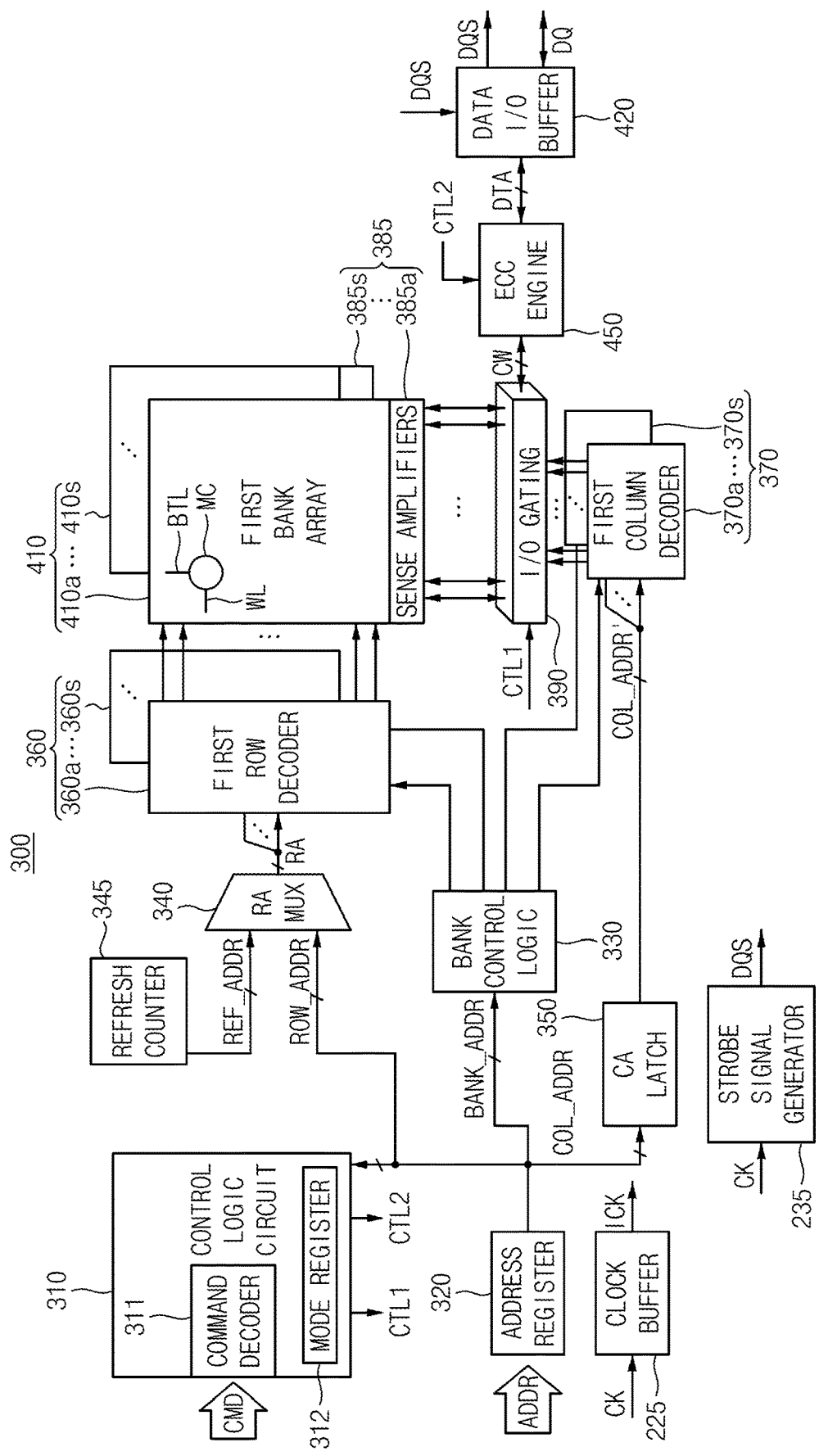
FIG. 20 is a block diagram illustrating an example of the semiconductor memory device in FIG. 19 according to example embodiments.

FIG. 20 is a block diagram illustrating an example of the semiconductor memory device in FIG. 19 according to example embodiments. Referring to FIG. 20, the semiconductor memory device 300 may include the control logic circuit 310, an address register 320, a bank control logic 330, a refresh counter 345, a row address multiplexer 340, a column address latch 350, a row decoder 360, a column decoder 370, the memory cell array 410, a sense amplifier unit 385, an input/output (I/O) gating circuit 390, the ECC engine 450, a clock buffer 325, a strobe signal generator 335 and a data I/O buffer 420.

The memory cell array 410 may include first through sixteenth bank arrays 410a~410s. The row decoder 360 may include first through sixteenth row decoders 360a~360s respectively coupled to the first through sixteenth bank arrays 410a~410s, the column decoder 370 may include first through sixteenth column decoders 370a~370s respectively coupled to the first through sixteenth bank arrays 410a~410s, and the sense amplifier unit 385 may include first through sixteenth sense amplifiers 385a~385s respectively coupled to the first through sixteenth bank arrays 410a~410s.

The first through sixteenth bank arrays 410a~410s, the first through sixteenth row decoders 360a~360s, the first through sixteenth column decoders 370a~370s and first through sixteenth sense amplifiers 385a~385s may form first through sixteenth banks. Each of the first through sixteenth bank arrays 410a~410s includes a plurality of memory cells MC formed at intersections of a plurality of word-lines WL and a plurality of bit-line BTL.

The address register 320 may receive the address ADDR including a bank address BANK_ADDR, a row address ROW ADDR and a column address COL_ADDR from the memory controller 30. The address register 320 may provide the received bank address BANK_ADDR to the bank control logic 330, may provide the received row address ROW ADDR to the row address multiplexer 340, and may provide the received column address COL_ADDR to the column address latch 350.

The address register 320 may employ the storage circuits 100 of FIG. 1 and may store the address ADDR including the bank address BANK_ADDR, the row address ROW ADDR and the column address COL_ADDR which are robust to soft errors. The bank control logic 330 may generate bank control signals in response to the bank address BANK_ADDR. One of the first through sixteenth row decoders 360a~360s corresponding to the bank address BANK_ADDR is activated in response to the bank control signals, and one of the first through sixteenth column decoders 370a~370s corresponding to the bank address BANK_ADDR is activated in response to the bank control signals.

The row address multiplexer 340 may receive the row address ROW ADDR from the address register 320, and may receive a refresh row address REF_ADDR from the refresh counter 345. The row address multiplexer 340 may selectively output the row address ROW ADDR or the refresh row address REF_ADDR as a row address RA. The row address RA that is output from the row address multiplexer 340 is applied to the first through sixteenth row decoders 360a~360s.

The refresh counter 345 may sequentially increase or decrease the refresh row address REF_ADDR in a normal refresh mode under control of the control logic circuit 310. The activated one of the first through sixteenth row decoders 360a~360s, by the bank control logic 330, may decode the row address RA that is output from the row address multiplexer 340, and may activate a word-line corresponding to the row address 3RA. For example, the activated row decoder applies a word-line driving voltage to the word-line corresponding to the row address.

The column address latch 350 may receive the column address COL_ADDR from the address register 320, and may temporarily store the received column address COL_ADDR. In some embodiments, in a burst mode, the column address latch 350 may generate column address COL_ADDR' that increment from the received column address COL_ADDR. The column address latch 350 may apply the temporarily stored or generated column address COL_ADDR' to the first through sixteenth column decoders 370a~370s.

The activated one of the first through sixteenth column decoders 370a~370s activates a sense amplifier corresponding to the bank address BANK_ADDR and the column address COL_ADDR through the I/O gating circuit 290. The I/O gating circuit 390 may include a circuitry for gating input/output data, and may further include input data mask logic, read data latches for storing data that is output from the first through sixteenth bank arrays 410a~410s, and write drivers for writing data to the first through sixteenth bank arrays 410a~410s.

Codeword CW read from one bank array of the first through sixteenth bank arrays 410a~410s is sensed by a sense amplifier coupled to the one bank array from which the data is to be read, and is stored in the read data latches. The codeword CW stored in the read data latches may be provided to the data I/O buffer 420 as data DTA after ECC decoding is performed on the codeword CW by the ECC engine 450. The data I/O buffer 420 may convert the data DTA into the data signal DQ and may transmit the data signal DQ along with the data strobe signal DQS to the memory controller 30.

The data signal DQ to be written in one bank array of the first through sixteenth bank arrays 410a~410s may be provided to the data I/O buffer 420 from the memory controller 30. The data I/O buffer 420 may convert the data signal DQ to the data DTA and may provide the data DTA to the ECC engine 450. The ECC engine 450 may perform an ECC encoding on the data DTA to generate parity data (bits), and the ECC engine 350 may provide the codeword CW including data DTA and the parity bits to the I/O gating circuit 390. The I/O gating circuit 390 may write the codeword CW in a sub-page in one bank array through the write drivers.

The data I/O buffer 320 may provide the data signal DQ from the memory controller 30 to the ECC engine 450 by converting the data signal DQ to the data DTA in a write operation of the semiconductor memory device 300 and may convert the data DTA to the data signal DQ from the ECC engine 350 and may transmit the data signal DQ and the data strobe signal DQS to the memory controller 30 in a read operation of the semiconductor memory device 300.

The ECC engine 450 may perform an ECC encoding (operation) and an ECC decoding (operation) on the data DTA based on a second control signal CTL2 from the control logic circuit 310. The clock buffer 325 may receive the clock signal CK, may generate an internal clock signal ICK by buffering the clock signal CK, and may provide the internal clock signal ICK to circuit components processing the command CMD and the address ADDR.

The strobe signal generator 335 may receive the clock signal CK, may generate the data strobe signal DQS based on the clock signal CK and may provide the data strobe signal DQS to the data I/O buffer 420.

The control logic circuit 310 may control operations of the semiconductor memory device 300. For example, the control logic circuit 310 may generate control signals for the semiconductor memory device 300 in order to perform a write operation, a read operation and a refresh operation. The control logic circuit 310 includes a command decoder 311 that decodes the command CMD received from the memory controller 30 and a mode register 312 that sets an operation mode of the semiconductor memory device 300.

For example, the command decoder 311 may generate the control signals corresponding to the command CMD by decoding a write enable signal, a row address strobe signal, a column address strobe signal, a chip select signal, etc. The control logic circuit 310 may generate a first control signal CTL1 for controlling the I/O gating circuit 390 and the second control signal CTL2 for controlling the ECC engine 450.

Figure 21:
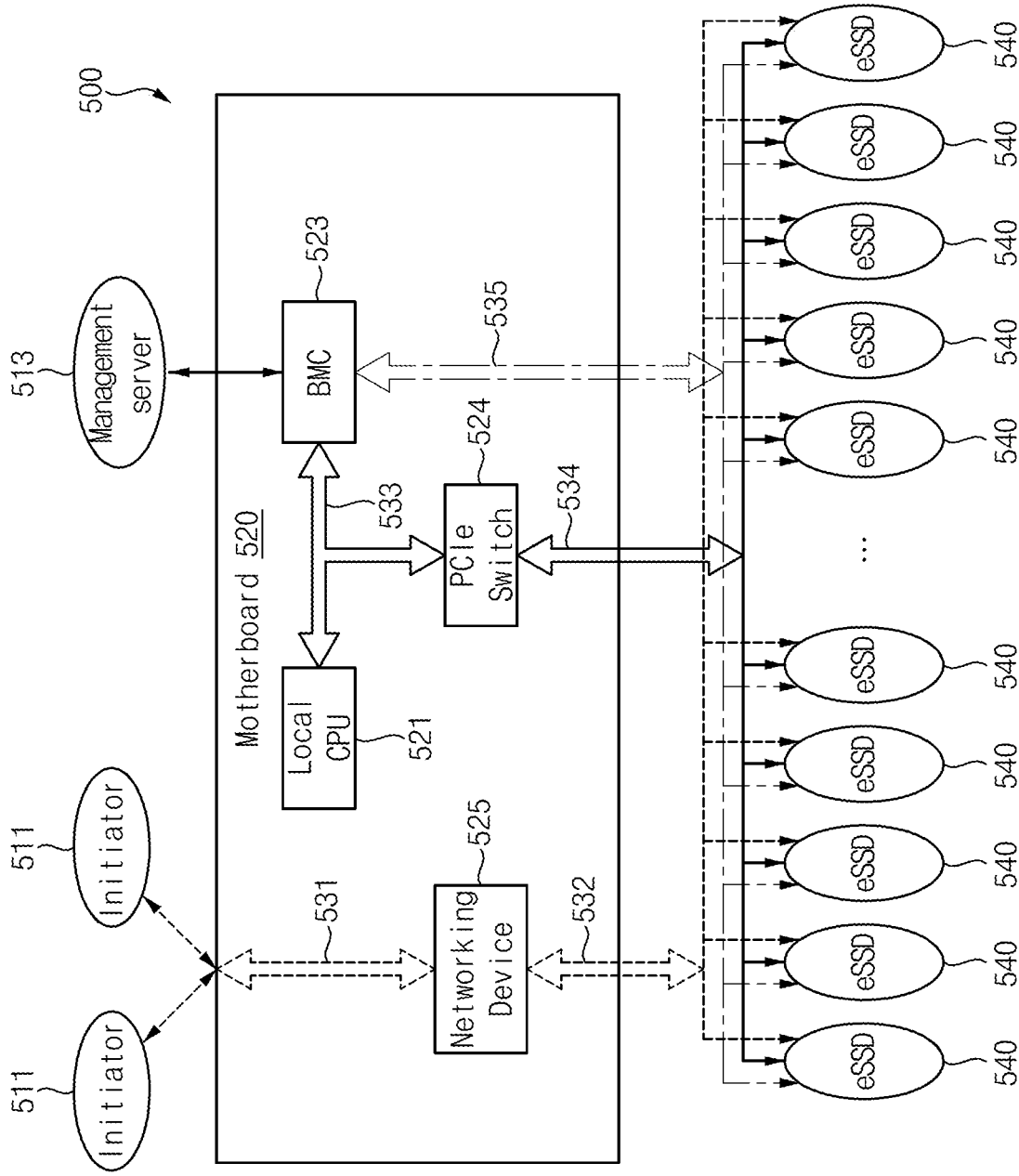
FIG. 21 is a block diagram illustrating an example of a computer storage according to example embodiments.

FIG. 21 is a block diagram illustrating an example of a computer storage according to example embodiments. A computer storage array, also called a disk array, is generally a data storage system to which a number of data storage devices, such as hard disk drives (HDDs) and solid-state disk drives (SSDs), are connected. Computer storage arrays are designed to be highly scalable and offer shared data access to multiple initiators, who may be endpoint clients, computer servers, and/or other data consumers.

Storage devices that support the Non-Volatile Memory Express over Fabrics (NVMe-oF) specification (hereinafter, "NVMe-oF devices" for convenience) are becoming more popular, especially for use in computer storage arrays, due to their high performance and scalability. NVMe-oF is a technology specification designed to enable NVMe message-based commands to transfer data between an initiator, such as a host computer, and an NVMe-oF device or system over a network such as Ethernet, Fibre Channel, and InfiniBand. Thus, an NVMe-oF device generally includes functions of both a networking device (e.g., has Ethernet controller(s)) and a storage device (e.g., has SSD(s)).

As a networking device, an NVMe-oF device is susceptible to cyber-attacks, such as a denial-of-service (DoS) attack. A DoS attack is a cyber-attack in which the perpetrator seeks to make a machine or network resource unavailable to its intended users by temporarily or indefinitely disrupting services of a host connected to the Internet. A DoS attack is typically accomplished by flooding the targeted machine or resource with superfluous requests in an attempt to overload systems and prevent some or all legitimate requests from being fulfilled. When the flooding comes from multiple sources, the DoS attack is considered a distributed DoS (DDoS) attack.

A DoS attack is analogous to a group of people crowding the entry door or gate to a shop or business, and not letting legitimate parties enter into the shop or business, disrupting normal operations. Thus, the objective of a typical DoS attack by itself is not to steal or expose confidential data stored on a computer server or storage array, but to simply overwhelm it with bogus traffic. However, a DoS attack has been known to be used as a distraction away from other more nefarious cyber-attacks.

In some cases, an NVMe-oF device whose firmware or software has been infected or compromised may become an unwitting participant in a DoS attack against other systems. Regardless of the scenario, detecting and countering DoS attacks often require companies to expend valuable resources. Moreover, the longer a DoS attack is prolonged, the more costly it may be to the company affected by the DoS attack.

Referring to FIG. 21, a computer storage array 500 may include computer motherboard 520, a local central processing unit (CPU) 521, a baseboard management controller (BMC) 523, a PCIe switch 524, a networking device 525, and a plurality of NVMe-oF devices 540. In this case, the NVMe-oF devices 540 may be Ethernet-enabled SSDs (eSSDs) including an Ethernet port, a PCIe port, and an SMBus port, and the networking device 525 may be a network address translation (NAT) router, network switch (e.g., layer 3 switch), etc. The computer storage array 500 provides one or more remote initiators 511 with access to one or more of the NVMe-oF devices 540 connected to the storage array 500. According to example embodiments, the local CPU 521, BMC 523, PCIe switch 524, and networking device 525 may be integrated or built into the motherboard 520 or may be installed onto the motherboard 520 as discrete components. These components may be implemented using hardware components, software components, or a combination of hardware and software components. Although FIG. 21 shows these components as separate components, one or more of these components may be combined. The computer motherboard 520 includes at least an Ethernet bus 531 and 532, a PCIe bus 533 and 534, and a SMBus 535. The local CPU 520 may run an operating system for managing networking protocols. The networking device 525 may monitor and route network traffic, at a packet level, to and from the NVMe-oF devices 106. The networking device 525 may have access to a list of known source/destination addresses, such as a network address translation table. Any new initiator that connects to the NVMe-oF devices may be added as an entry in the list or table. The list of known source/destination addresses may be stored in a look-up table that employs the storage circuits 100 and may be robust to soft errors.

The BMC 523 may communicate with a management server 513 via an out-of-band connection separate from an in-band connection established via the Ethernet bus. The BMC 523 may communicate with the management server 513 using an Intelligent Platform Management Interface (IPMI). The IPMI is a set of computer interface specifications for a computer subsystem, such as the BMC 523, that provides management and monitoring capabilities independently of the system's local CPU, firmware, and operating system.

The BMC 523 and the local CPU 522 may be locally connected to the NVMe-oF devices 540 via local buses. For example, the PCIe switch 524 connects the BMC 523 and the local CPU 522 with each of the NVMe-oF devices 540 via a separate PCIe bus 533 and 534. The BMC 523 and the local CPU 522 are each capable of configuring the network settings of NVMe-oF devices 540. The BMC 103 may further detect a DoS attack based on the monitoring (e.g., monitoring the statistics) of the network traffic, to and from the NVMe-oF devices 540, by the networking device 525.

Aspects of the present disclosure may be applied to systems using DICE latch for storing data. For example, aspects of the present disclosure may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A storage circuit, comprising:
   a multi-stage latch circuit including first to fourth transistor pairs that respectively comprise a pull-up transistor and a pull-down transistor connected in series through a corresponding one of first to fourth storage nodes, with each of the second to third storage nodes being connected to a gate of a pull-down transistor of a transistor pair in a preceding stage and a gate of a pull-up transistor of a transistor pair in a following stage;
   an access circuit electrically coupled to a word-line, a corresponding complementary word-line and a bit-line, the access circuit having a plurality of access transistors of different conductivity type therein, and the access transistors electrically coupled to at least two of the first to fourth storage nodes and configured to enable: (i) writing of data bits into at least some of the first to fourth storage nodes, and (ii) reading of data bits from at least some of the first to fourth storage nodes; and
   a control circuit configured to control the access circuit during the writing and reading, the control circuit configured to perform a write operation on the multi-stage latch circuit by switching the word-line from a logic low level to logic high level at a first time point and then maintaining the word-line at the logic high level during a first time interval extending from the first time point to a second time point, and by switching the complementary word-line from a logic high level to a logic low level during a second time interval that commences at a third time point, which occurs between the first time point and the second time point.

2. The storage circuit of claim 1,
   wherein the access circuit includes:
      a first PMOS access transistor having a source electrically coupled to the first storage node, a gate electrically coupled to the complementary word-line, and a drain electrically coupled to the bit-line; and
      a first NMOS access transistor having a source electrically coupled to the third storage node, a gate electrically coupled to the word-line and a drain electrically coupled to the bit-line;
   wherein the first storage node is electrically connected to a gate of a pull-down transistor in the fourth transistor pair; and
   wherein the fourth storage node is electrically connected to a gate of a pull-up transistor in the first transistor pair.

3. The storage circuit of claim 2, wherein the control circuit is configured to:

write data bits into the first storage node and the third storage node based on a first data bit provided through the bit-line, by turning on the first PMOS access transistor and the first NMOS access transistor, during the write operation; and read a data bit stored in the third storage node by turning off the first PMOS access transistor and turning on the first NMOS access transistor, or read a data bit stored in the first storage node by turning on the first PMOS access transistor and turning off the first NMOS access transistor, during a read operation.

4. The storage circuit of claim 2, wherein each of the first and second transistor pairs include:
- a first active pattern and a second active pattern, which extend in a first direction and are spaced apart from each other in a second direction crossing the first direction; and
- a first gate pattern and a second gate pattern provided on the first active pattern and the second active pattern, wherein the first gate pattern and the second gate pattern extend in the second direction and are spaced apart from each other in the first direction; and wherein each of the third and fourth transistor pairs include:
- a third active pattern and a fourth active pattern, which extend in the first direction and are spaced apart from each other in the second direction, the third active pattern being spaced apart from the first active pattern in the first direction and the fourth active pattern being spaced apart from the second active pattern in the first direction; and
- a third gate pattern and a fourth gate pattern provided on the third active pattern and the fourth active pattern, wherein the third gate pattern and the fourth gate pattern extend in the second direction and are spaced apart from each other in the first direction.

5. The storage circuit of claim 4, wherein the first PMOS access transistor includes:
- the third active pattern; and
- a fifth gate pattern provided on the third active pattern, the fifth gate pattern being spaced apart from the fourth gate pattern in the first direction and extending in the second direction; and wherein the first NMOS access transistor includes:
- the fourth active pattern; and
- a sixth gate pattern provided on the fourth active pattern, the sixth gate pattern being spaced apart from the fourth gate pattern in the first direction, and being spaced apart from the fifth gate pattern in the second direction and extending in the second direction.

6. The storage circuit of claim 2, further comprising:

a power supply voltage selector configured to provide the first to fourth transistor pairs with a first power supply voltage having a first voltage level during the write operation, and configured to provide the first to fourth transistor pairs with a second power supply voltage having a second voltage level greater than the first voltage level during a read operation.

7. The storage circuit of claim 1, wherein the access circuit includes:

a first PMOS access transistor having a source electrically coupled to the first storage node, a gate electrically coupled to the complementary word-line, and a drain electrically coupled to a first bit-line; and a first NMOS access transistor having a source electrically coupled to the third storage node, a gate electrically coupled to the word-line, and a drain electrically coupled to a second bit-line.

8. The storage circuit of claim 7, wherein the control circuit is configured to:

write data bits into the first to fourth storage nodes based on a first data bit provided through the first bit-line and the second bit-line, by turning on the first PMOS access transistor and the first NMOS access transistor during the write operation; and read a data bit stored in the third storage node by turning off the first PMOS access transistor and turning on the first NMOS access transistor during a read operation.

9. The storage circuit of claim 1, wherein the access circuit includes:

a first PMOS access transistor having a source electrically coupled to the first storage node, a gate electrically coupled to the complementary word-line, and a drain electrically coupled to the bit-line;

a second PMOS access transistor having a source electrically coupled to the second storage node, a gate electrically coupled to the complementary word-line, and a drain electrically coupled to a complementary bit-line;

a first NMOS access transistor having a source electrically coupled to the third storage node, a gate electrically coupled to the word-line, and a drain electrically coupled to the bit-line; and a second NMOS access transistor having a source electrically coupled to the fourth storage node, a gate electrically coupled to the word-line, and a drain electrically coupled to the complementary bit-line.

10. The storage circuit of claim 9, wherein the control circuit is configured to:

write data bits into the first to fourth storage nodes in response to a first data bit provided through the bit-line, by turning on the first PMOS access transistor, the second PMOS access transistor, the first NMOS access transistor and the second NMOS access transistor, during the write operation; and reading a data bit from the third storage node by turning off the first PMOS access transistor and the second PMOS access transistor, and by turning on the first NMOS access transistor and the second NMOS access transistor, during a read operation.

11. The storage circuit of claim 9, wherein the first transistor pair and the second transistor pair include:
- a first active pattern and a second active pattern, which extend in a first direction and are spaced apart from each other in a second direction crossing the first direction; and
- a first gate pattern and a second gate pattern provided on the first active pattern and the second active pattern, wherein the first gate pattern and the second gate pattern extend in the second direction and are spaced apart from each other in the first direction; and wherein the third transistor pair and the fourth transistor pair include:
- a third active pattern and a fourth active pattern, which extend in the first direction and are spaced apart from each other in the second direction, the third active pattern being spaced apart from the first active pattern in the first direction and the fourth active pattern being spaced apart from the second active pattern in the first direction; and a third gate pattern and a fourth gate pattern provided on the third active pattern and the fourth active pattern, wherein the third gate pattern and the fourth gate pattern extend in the second direction and are spaced apart from each other in the first direction.

12. The storage circuit of claim 11,
wherein the first PMOS access transistor includes:
the third active pattern; and
a fifth gate pattern provided on the third active pattern, the fifth gate pattern being spaced apart from the fourth gate pattern in the first direction and extending in the second direction;
wherein the first NMOS access transistor includes:
the fourth active pattern; and
a sixth gate pattern provided on the fourth active pattern, the sixth gate pattern being spaced apart from the fourth gate pattern in the first direction, being spaced apart from the fifth gate pattern in the second direction and extending in the second direction;
wherein the second PMOS access transistor includes:
the first active pattern; and
a seventh gate pattern provided on the first active pattern, the seventh gate pattern being spaced apart from the first gate pattern in the first direction and extending in the second direction; and
wherein the second NMOS access transistor includes:
the second active pattern; and
an eighth gate pattern provided on the second active pattern, the eighth gate pattern being spaced apart from the first gate pattern in the first direction, being spaced apart from the seventh gate pattern in the second direction and extending in the second direction.

13. A semiconductor device, comprising:
a plurality of dual interlocked storage cell (DICE) latches electrically coupled in parallel to a bit-line, and individually coupled to corresponding pairs of true and complementary word lines;
a write driver connected to the bit-line; and
a control circuit configured to control each of the plurality of DICE latches through their corresponding true and complementary word lines;
wherein each of the plurality of DICE latches includes:
a latch circuit including first to fourth transistor pairs, which each comprise a pull-up transistor and a pull-down transistor electrically connected in series through a corresponding one of first to fourth storage nodes, wherein each of the second and third storage nodes is connected to a gate of a pull-down transistor of a transistor pair in a preceding stage and a gate of a pull-up transistor of a transistor pair in a following stage; and
an access circuit having access transistors having different conductivity types therein, the access transistors electrically coupled to at least two storage nodes of the first to fourth storage nodes, and the access circuit configured to write data bits into at least a portion of the first to fourth storage nodes and read data bits from at least a portion of the first to fourth storage nodes;
wherein the access circuit includes:
a first PMOS access transistor having a source electrically coupled to the first storage node, a gate electrically coupled to a complementary word-line, and a drain electrically coupled to a bit-line;
a second PMOS access transistor having a source electrically coupled to the second storage node, a gate electrically coupled to the complementary word-line, and a drain electrically coupled to a complementary bit-line;
a first NMOS access transistor having a source electrically coupled to the third storage node, a gate electrically coupled to a word-line, and a drain electrically coupled to the bit-line; and
a second NMOS access transistor having a source electrically coupler to the fourth storage node, a gate electrically coupled to the word-line, and a drain electrically coupled to the complementary bit-line;
wherein the control circuit is configured to:
write data bits into the first to fourth storage nodes based on a first data bit provided through the bit-line, by turning on the first PMOS access transistor, the second PMOS access transistor, the first NMOS access transistor and the second NMOS access transistor, during a write operation; and
read a data bit stored in the third storage node by turning off the first PMOS access transistor and the second PMOS access transistor and by turning on the first NMOS access transistor and the second NMOS access transistor, during a read operation.

14. A storage circuit, comprising:
a latch circuit including first to fourth transistor pairs, each comprising a p-channel metal-oxide semiconductor (PMOS) transistor and a n-channel metal-oxide semiconductor (NMOS) transistor connected in series through a corresponding one of first to fourth storage nodes, wherein each of the second and third storage nodes is electrically coupled to a gate of an NMOS transistor of a transistor pair in a preceding stage and a gate of a PMOS transistor of a transistor pair in a following stage;
an access circuit including access transistors connected to the first to fourth storage nodes, the access circuit configured to store data bits in at least a portion of the first to fourth storage nodes or configured to read data bits stored in at least a portion of the first to fourth storage nodes; and
a control circuit configured to control the access circuit;
wherein the access circuit includes:
a first NMOS access transistor having a source electrically coupled to the first storage node, a gate electrically coupled to a word-line, and a drain electrically coupled to a bit-line;
a second NMOS access transistor having a source electrically coupled to the second storage node, a gate electrically coupled to the word-line, and a drain electrically coupled to a complementary bit-line;
a third NMOS access transistor having a source electrically coupled to the third storage node, a gate electrically coupled to a write word-line, and a drain electrically coupled to a write bit-line; and
a fourth NMOS access transistor having a source electrically coupled to the fourth storage node, a gate electrically coupled to the write word-line, and a drain electrically coupled to a complementary write bit-line.

15. The storage circuit of claim 1, wherein the control circuit is further configured to switch the word-line from the logic high level to the logic low level commencing at the second time point.

16. The storage circuit of claim 15, wherein the control circuit is further configured to switch the complementary word-line from the logic low level to the logic high level commencing at the second time point.

17. The storage circuit of claim 1, wherein the complementary word-line is held at the logic high level during a time interval extending from the first time point to the third time point.

18. The storage circuit of claim 17, wherein the word-line is switched to and held at the logic high level during the time interval extending from the first time point to the third time point, while the complementary word-line is also held at the logic high level.

19. The device of claim 13,
- wherein the plurality of DICE latches includes a first DICE latch electrically coupled to a corresponding first word line and a corresponding first complementary word line; and
- wherein the control circuit is configured to perform a write operation on the first DICE latch by switching the first word line from a logic low level to logic high level at a first time point and then maintaining first word line at the logic high level during a first time interval extending from the first time point to a second time point, and by switching the first complementary word line from a logic high level to a logic low level during a second time interval that commences at a third time point, which occurs between the first time point and the second time point.

* * * * *